US006566217B1

(12) United States Patent
Maki

(10) Patent No.: US 6,566,217 B1
(45) Date of Patent: *May 20, 2003

(54) MANUFACTURING PROCESS FOR SEMICONDUCTOR DEVICE

(75) Inventor: Yukio Maki, Tokyo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 579 days.

(21) Appl. No.: 08/731,236

(22) Filed: Oct. 11, 1996

Related U.S. Application Data

(63) Continuation-in-part of application No. 08/684,214, filed on Jul. 19, 1996, now abandoned.

(30) Foreign Application Priority Data

Jan. 16, 1996 (JP) .................................................. 8-5161

(51) Int. Cl.[7] ......................................... H01L 21/8222
(52) U.S. Cl. ....................... 438/340; 438/203; 438/202; 438/205; 438/234
(58) Field of Search ........................... 438/340, 203, 438/234, 202, 205

(56) References Cited

U.S. PATENT DOCUMENTS

| 4,030,954 | A | | 6/1977 | Horie | |
|---|---|---|---|---|---|
| 4,589,936 | A | * | 5/1986 | Komatsu | |
| 4,721,684 | A | * | 1/1988 | Musumeci | |
| 4,882,294 | A | * | 11/1989 | Christenson | |
| 5,066,602 | A | * | 11/1991 | Takemoto et al. | 438/234 |
| 5,095,355 | A | | 3/1992 | Shiomi et al. | |
| 5,340,762 | A | * | 8/1994 | Vora | 438/234 |
| 5,943,564 | A | * | 8/1999 | Chen et al. | |

FOREIGN PATENT DOCUMENTS

| DE | 25 35 864 | 3/1976 |
|---|---|---|
| DE | 26 07 089 | 9/1976 |
| EP | 0 089 504 | 9/1983 |
| EP | 0 143 670 | 6/1985 |
| GB | 1 502 122 | 2/1978 |
| GB | 1 534 338 | 12/1978 |
| JP | 60-22358 | 2/1985 |
| JP | 60-194561 | 10/1985 |
| JP | 1-186673 | 7/1989 |
| JP | 3-14267 | 1/1991 |
| JP | 3-85754 | 4/1991 |
| JP | 4-61268 | 2/1992 |

OTHER PUBLICATIONS

H. Momose et al, High Performance 1.0 $\mu$M N–Well CMOS Bipolar Technology, Tech Digest, Symposium on VLSI Technology 1983 pp. 40–41.

* cited by examiner

*Primary Examiner*—Long Pham
*Assistant Examiner*—S A Brairton
(74) *Attorney, Agent, or Firm*—Oblon, Spivak, McClelland, Maier & Neustadt, P.C.

(57) ABSTRACT

A manufacturing process for a semiconductor device including a semiconductor memory region and a peripheral circuit region including bipolar transistors, in which a plurality of bipolar transistors with characteristics different from each other are effectively manufactured according to design requirements while minimizing the number of manufacturing steps. In manufacturing the semiconductor memory region and the bipolar transistors in the peripheral circuit region, a plurality of holes for forming the bipolar transistors are provided in the peripheral circuit region in correspondence to a plurality of steps for forming holes for interlayer insulating films in the semiconductor memory region, whereby the bipolar transistors with characteristics different from each other are formed in the holes of the peripheral region.

23 Claims, 30 Drawing Sheets

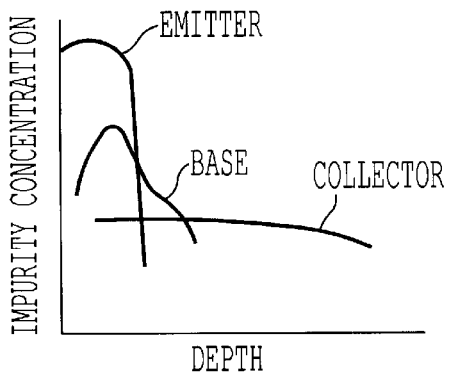
FIG. 3A(1)
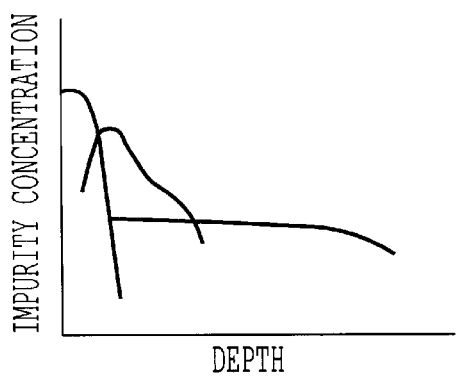
FIG. 3A(2)
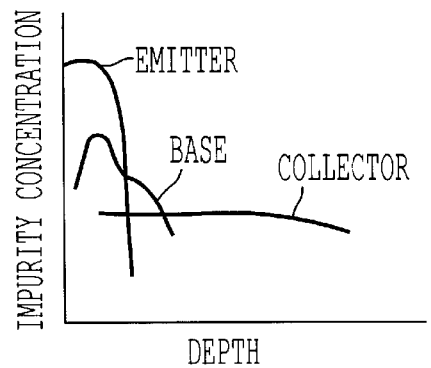
FIG. 3B(1)
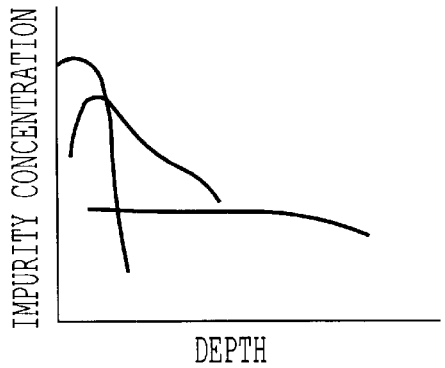
FIG. 3B(2)
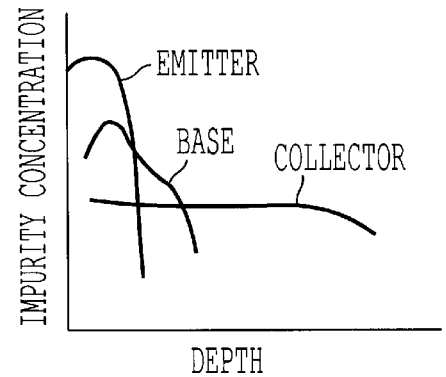
FIG. 3C(1)
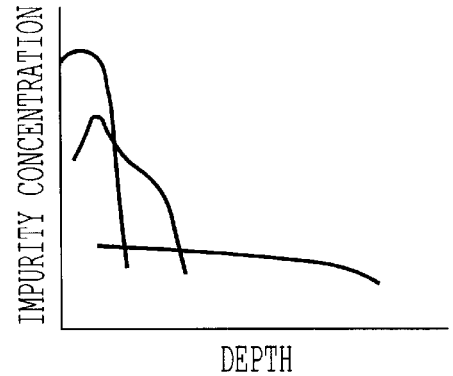
FIG. 3C(2)

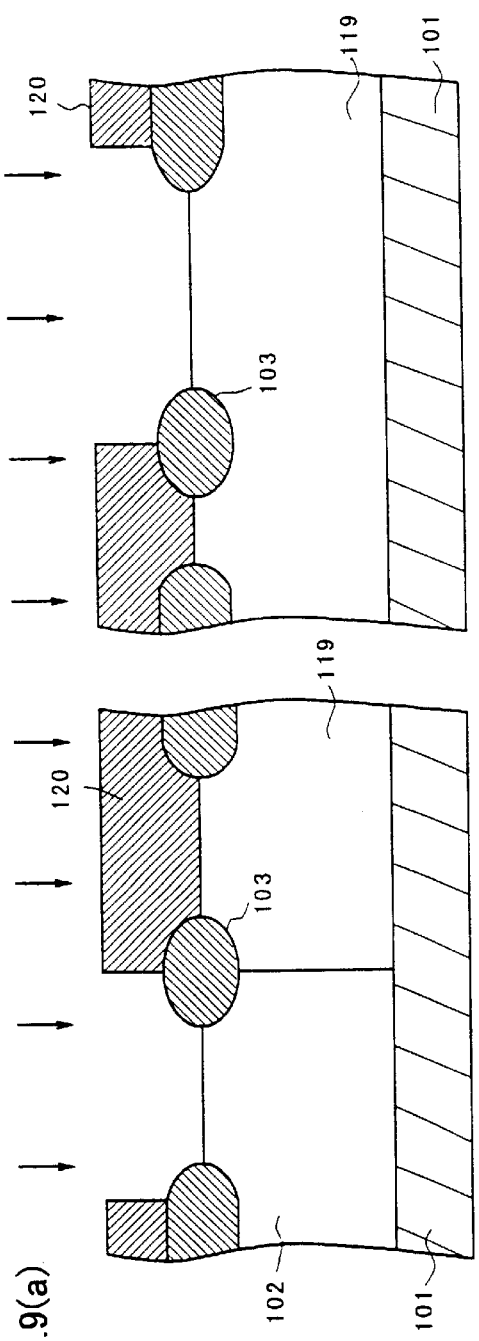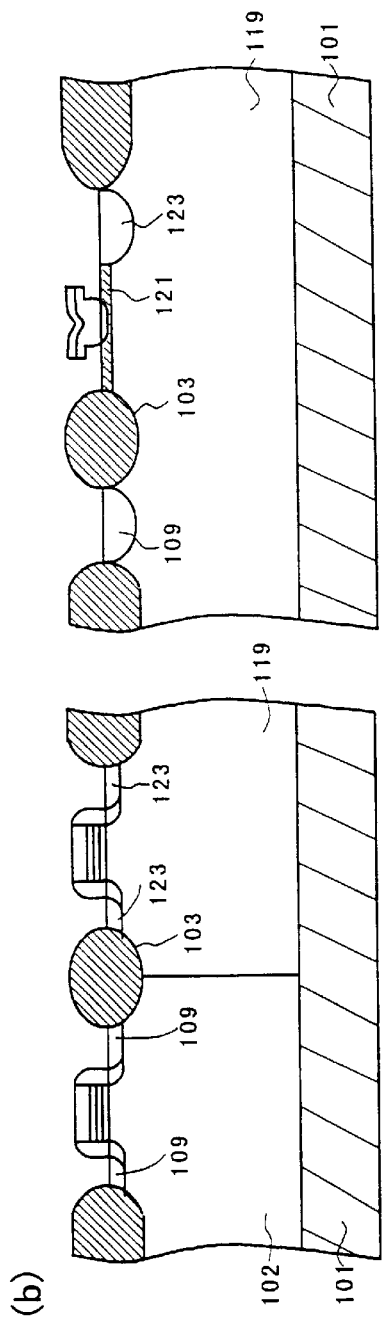

FIG. 17(a)
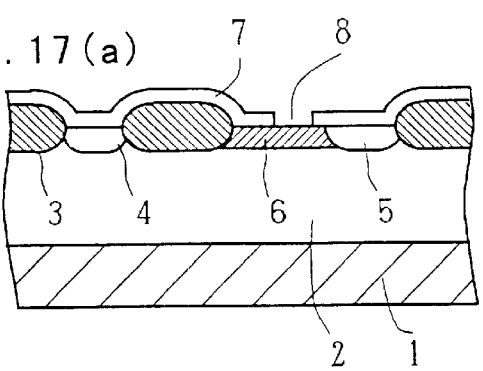
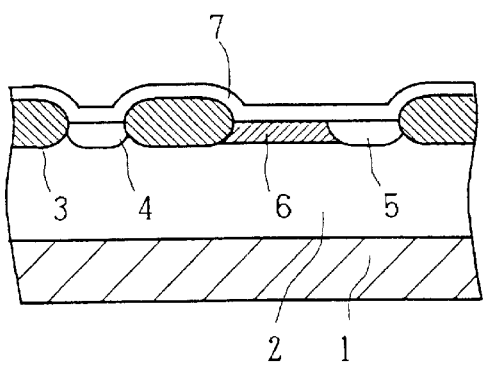
FIG. 17(b)
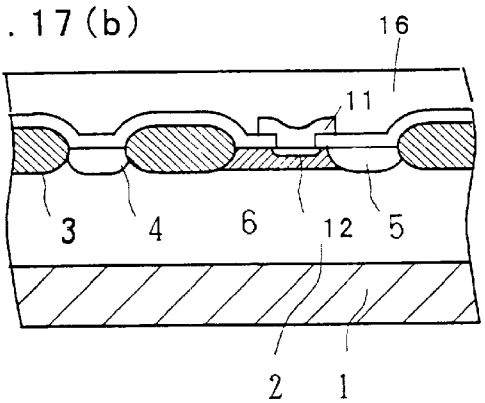
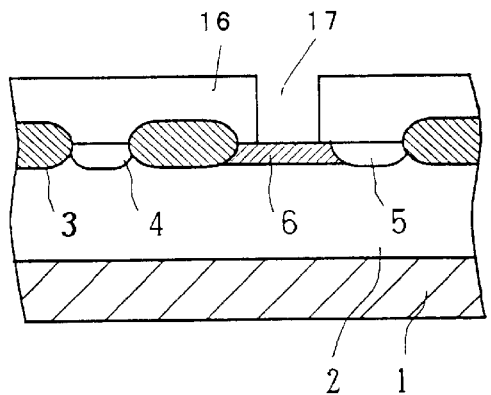
FIG. 17(c)
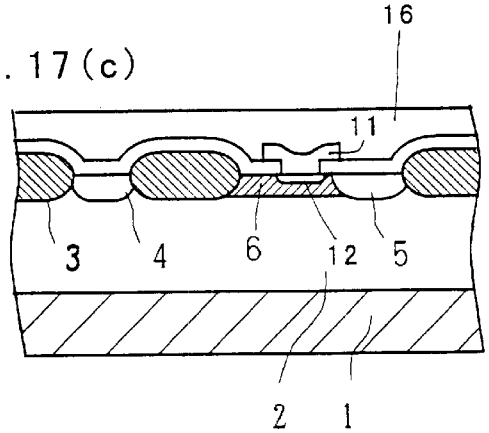
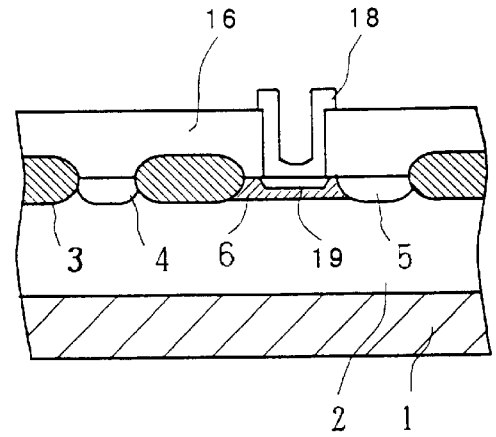

| FIG.5-7 SRAM | FIG. 8 BIP.TR. | FIG. 10 BIP.TR. | FIG. 12 BIP.TR. | FIG. 13 BIP.TR. |
|---|---|---|---|---|
| p-type substrate 101 | p-type substrate 101 | p-type substrate 101 | p-type substrate 101 | p-type substrate 101 |
| well 102,119 | well 119 | well 119 | well 119 | well 119 |
| isolation oxide film 103 | isolation oxide film 103 | isolation oxide film 103 | isolation oxide film 103 | isolation oxide film 103 |
| gate oxide film 104 | | | | |
| | resist pattern 120 | resist pattern 120 | resist pattern 120 | resist pattern 120 |
| | base layer 121 | base layer 121* | base layer 121* | base layer 121* |
| polysilicon 105 | | | | |
| gate contact hole 106(hole I) | emitter opning 106 | | | |
| | emitter 122 | | | |
| polysilicon 107 | emitter electrode 107 | | | |
| source/drain region 109 | collecor lead out 109 | collecor lead out 109 | collecor lead out 109 | collecor lead out 109 |
| | | | | emitter 128 |
| | base lead-out 123 | base lead-out 123 | base lead-out 123 | base lead-out 123 |
| | | resist pattern 124 | resist pattern 125 | resist pattern 125 |
| | | base layer 121** | base layer 121** | base layer 121** |
| insulater film 111 | | insulater film 111 | | |
| first polycontact hole 112(hole II) | | emitter opening 112 | | |
| | | emitter 122 | | |
| polycide 113 | | emitter electrode 113 | | |
| insulating film 114 | | | insulating film 114 | |
| second polycontact hole 115(hole III) | | | emitter opening 115 | |
| | | | emitter 122 | |
| | | | emitter electrode 116 | |
| polysilicon film 116 | | | | |
| insulating film 117 | | | | insulating film 117 |
| first contact hole 118(hole IV) | | | | emitter opning 118 |
| wiring layer 118a | | | | wiring layer 118a |

\* may be concurrently implanted with that for threshold voltage adjustment for NMOS trandistor
\*\* may be concurrently implanted with p- immplantation for PMOS trandistor

FIG.26

|  | FIG.14 A | B | FIG.15 C | D | FIG.17 G | H |
|---|---|---|---|---|---|---|
| p-type substrate | 1 | 1 | 1 | 1 | 1 | 1 |
| n type well | 2 | 2 | 2 | 2 | 2 | 2 |
| isolation oxide film | 3 | 3 | 3 | 3 | 3 | 3 |
| base layer | 6 | 6 | 6 | 6 | 6 | 6 |
| collector lead out | 4 | 4 | 4 | 4 | 4 | 4 |
| base lead out | 5 | 5 | 5 | 5 | 5 | 5 |
| insulater film | 7 | 7 | 7 | 7 | 7 | 7 |
| emitter opening | 8 | 8 | 8 | 8 | 8 |  |
| polysilicon |  |  | 13 | 13 |  |  |
| resist pattern | 9 | 9 | 14 | 14 |  |  |
| polysilicon dope |  |  |  | 13 |  |  |
| emitter |  | 10 |  |  |  |  |
| emitter electrode | 11 | 11 | 11 | 15 | 11 |  |
| emitter | 12 |  | 12 | 10 | 12 |  |
| insulater film |  |  |  |  | 16 | 16 |
| emitter opening |  |  |  |  |  | 17 |
| emitter electrode |  |  |  |  |  | 18 |
| emitter |  |  |  |  |  | 19 |

FIG.27

|  | FIG. 18 | | FIG. 19 | | FIG. 20 | |
|---|---|---|---|---|---|---|
|  | I | J | K | L | M | N |
| p-type substrate | 1 | 1 | 1 | 1 | 1 | 1 |
| n type well | 2 | 2 | 2 | 2 | 2 | 2 |
| isolation oxide film | 3 | 3 | 3 | 3 | 3 | 3 |
| collector lead out | 4 | 4 | 4 | 4 | 4 | 4 |
| base lead out | 5 | 5 | 5 | 5 | 5 | 5 |
| base layer | 6 | 6 | 6 | 6 | 24 | 24 |
| insulater film |  |  | 7 | 7 | 7 | 7 |
| emitter opening |  |  | 8 | 8 | 8 | 8 |
| resist pattern | 20 | 20 | 22 | 22 | 25 | 25 |
| base implant |  | 21 |  | 23 |  | 26 |
| insulater film | 7 | 7 |  |  |  |  |
| emitter opening |  |  |  |  |  |  |
| emitter |  |  |  |  |  | 27 |
| emitter electrode | 11 | 11 | 11 | 11 | 11 | 11 |
| emitter | 12 | 12 | 12 | 12 | 28 |  |

FIG.28

|  | FIG.21 | | FIG.22 | | FIG.23 | |
|---|---|---|---|---|---|---|
|  | P | Q | R | S | T | U |
| p-type substrate | 1 | 1 | 1 | 1 | 1 | 1 |
| n type well | 2 | 2 | 2 | 2 | 2 | 2 |
| isolation oxide film | 3 | 3 | 3 | 3 | 3 | 3 |
| resist pattern | 29 | 29 | 31 | 31 |  |  |
| collector implant |  | 30 |  | 32 |  |  |
| collector lead out | 4 | 4 | 4 | 4 | 4 | 4 |
| base lead out | 5 | 5 | 5 | 5 | 5 | 5 |
| base layer | 6 | 6 | 6 | 6 | 6 | 6 |
| insulater film | 7 | 7 | 7 | 7 | 7 | 7 |
| emitter opening |  |  |  |  | 8 | 8 |
| resist pattern |  |  |  |  | 33 | 33 |
| collector implant |  |  |  |  |  | 34 |
| emitter electrode | 11 | 11 | 11 | 11 | 11 | 11 |
| emitter | 12 | 12 | 12 | 12 | 12 | 12 |

MANUFACTURING PROCESS FOR SEMICONDUCTOR DEVICE

This is a Continuation in Part of application Ser. No. 08/684,214, filed Jul. 19, 1996, now abandoned.

BACKGROUND OF THE INVENTION

1. Field of the Invention

The present invention relates to a semiconductor device and a manufacturing process thereof, and more particularly, to a semiconductor device and a manufacturing process thereof including a MOS transistor and a bipolar transistor.

2. Description of the Background

Semiconductor devices often include several types of bipolar transistors of different characteristics. For example, a semiconductor memory device requires a plurality of bipolar transistors with different-characteristics in a peripheral circuit region, which includes decoder circuit, buffer circuit, etc, formed around a semiconductor memory circuit region or a memory cell region.

FIG. 1 illustrates a characteristic of a semiconductor device which exhibits changes of current amplification (hfe) and breakdown voltage (BVces, BVceo) against process conditions (axis of abscissa). As seen in FIG. 1, when the breakdown voltage (BVces, BVceo) is made large as shown at a point A of the process condition, the current amplification (hfe) becomes small, while, when the current amplification (hfe) is made large as shown at a point B of the process condition, the breakdown voltage (BVces, BVceo) becomes smaller.

FIG. 2 shows the same characteristic curve as shown above for illustrating a setting of the process condition. FIG. 2 shows a range of process conditions for satisfying both current amplification and breakdown voltage where the current amplification (hfe) exceeds the magnitude required by the design, and the breakdown voltage (BVces, BVceo) begins to exceed the value required by the design.

In a conventional method for manufacturing a semiconductor device including a plurality of bipolar transistors, the same specific kind of the current amplification (hfe) and the breakdown voltage (BVces, BVceo) are obtained for the bipolar transistors simultaneously manufactured. The impurity concentration profile for an emitter, base and collector is optimized so that the breakdown voltage can be assured, and so that the current amplification (hfe) required by the design can be obtained. This process includes an approach to change an emitter profile as shown in FIG. 3a, to change a base profile as shown in FIG. 3b, or to change a collector profile as shown in FIG. 3c. In addition, the size of a bipolar transistor is changed to modify the characteristics depending on the usage. However, the device is becoming constantly miniaturized so that it is getting harder to satisfy both requirements for large current amplification (hfe) and high breakdown voltage.

SUMMARY OF THE INVENTION

Accordingly, the objects of the present invention are to solve the above requirements, and to provide an efficient process for manufacturing a semiconductor device which includes bipolar transistors of different characteristics, in a memory circuit region, and/or in a peripheral circuit region, which includes decoder, buffer, etc, formed around the semiconductor memory circuit region or a cell region, in response to the design requirements. The present invention is preferably applied to manufacturing concurrently a memory circuit having MOS transistors such as SRAM memory, and bipolar transistors disposed in its peripheral circuit region and/or in the memory circuit region itself.

According to an aspect of the present invention, there is provided a manufacturing process for a semiconductor device which includes a semiconductor memory circuit region containing semiconductor memories, and a peripheral circuit region disposed around the semiconductor circuit region and containing bipolar transistors. In the process, a plurality of holes are provided selectively in an insulating film of the semiconductor memory circuit region through a resist pattern; and concurrently a plurality of holes are provided selectively in an insulating film of the peripheral circuit region through a resist pattern; and bipolar transistors are formed with characteristics different from each other at the locations of the holes in the peripheral circuit region and/or in the memory circuit region.

In the manufacturing process as set forth above, the bipolar transistors with characteristics different from each other are formed by first forming emitter electrode layers in a plurality of holes in the peripheral circuit region and/or in the memory circuit region, covering the emitter electrode layer in at least one of the holes with a resist, and implanting into the emitter layer in the other of the holes impurity ions to form a different emitter.

Alternatively, as set forth, the bipolar transistors are formed by first forming emitter electrode layers in a plurality of holes in the peripheral circuit region and/or in the memory circuit region, and implanting ions in the electrode layers in a plurality of holes. Then in at least one of the holes, the emitter electrode layer is covered with a resist, and in the other of the holes impurity ions are implanted in an emitter electrode layer to form a different emitter.

In the manufacturing process as set forth above, the bases of the bipolar transistors are formed as follows. While a location of one of a plurality of holes in the peripheral circuit region and/or in the memory circuit region is covered with a resist, impurity ions are implanted in the other of the holes to form a different base.

Alternatively, while one of a plurality of holes in the peripheral circuit region and/or in the memory circuit region is covered with a resist, impurity ions are implanted in the other of the holes to form a different base.

According to another aspect of the present invention as set forth, the bipolar transistors are formed as follows. While one of a plurality of holes in the peripheral circuit region and/or in the memory circuit region is covered with a resist, plural kinds of impurity ions are implanted in the other of the holes to form a different base and a different emitter.

According to another aspect of the present manufacturing process, the bipolar transistors are formed as follows. While at least one location for forming a transistor in the peripheral circuit region is covered with a resist, additional impurity ions are implanted in the other location(s) for forming a transistor in the peripheral circuit region and/or in the memory circuit region to form a different collector region(s) by changing a concentration of impurity in the collector regions.

In another aspect of the manufacturing process as set forth above, the bipolar transistors are formed as follows. While at least one location for forming a transistor in the peripheral circuit region and/or in the memory circuit region is covered with a resist, impurity ions are implanted additionally in the other locations for forming a transistor in the peripheral circuit region to form different collector layer(s) by providing high concentration layer in the collector region(s).

Alternatively, the bipolar transistors are formed by covering at least one of a plurality of holes in the peripheral circuit region with a resist, and implanting impurity ions in the other(s) of the holes to form a different collectors.

According to yet another aspect of this invention, the bipolar transistors are formed as follows. While an emitter is formed either by way of implanting ions or diffusing impurity into a base formed either by way of ion implantation or impurity diffusion in one of the holes in the peripheral circuit region and/or in the memory circuit region, an emitter is formed by implanting ions in a well of one conductivity type surrounded by another well of another conductivity type in the other of the holes in the peripheral circuit region and/or in the memory circuit region.

Further, according to the present invention, there is provided a manufacturing process for a semiconductor device which includes a semiconductor memory circuit region containing semiconductor memories, and a peripheral circuit region disposed around the semiconductor memory circuit region, and containing bipolar transistors, in which a plurality of holes are provided selectively in the insulating films through resist patterns in different manufacturing steps in the semiconductor memory region, and a plurality of holes are concurrently provided selectively in the insulating films through resist patterns in correspondence to the different manufacturing steps in the peripheral circuit region, and bipolar transistors are formed with characteristics different from each other at locations of the holes in the peripheral circuit region and/or in the memory circuit region.

In the manufacturing process as set forth above, the bipolar transistors are formed as follows. First, one type of emitter is formed by ion implantation or impurity diffusion in one hole provided in a manufacturing step in the peripheral circuit region and/or in the memory circuit region, then another type of emitter is formed in the other hole provided in another step in the peripheral circuit region and/or in the memory circuit region.

Further, in the manufacturing process as set forth above, at least one of the holes provided in one of a plurality of different manufacturing steps in the peripheral circuit region is covered with a resist, and a different base is formed by implanting impurity ions in the other(s) of the holes formed in another step in the peripheral circuit region.

Further, in the manufacturing process as set forth above, at least one hole provided in one manufacturing step in the peripheral circuit region and/or in the memory circuit region is covered with a resist, and then ion implantation is performed in the other hole(s) provided in another manufacturing step in the peripheral circuit region and/or in the memory circuit region to obtain a different collector.

In the manufacturing process as set forth above, the bipolar transistors are formed as follows. First, an emitter is formed by implanting ions into a base formed by ion implantation or impurity diffusion in one hole provided in one manufacturing step in the peripheral circuit region and/or in the memory circuit region, then a different emitter is formed by implanting ions in a well of one conductivity type surrounded by another well of another conductivity type in the other hole provided in another step in the peripheral circuit region and/or in the memory circuit region.

Although the invention as stated above is directed to the situation where the holes in the memory circuit region and the holes in the peripheral region are formed concurrently, the present invention is also applicable to a manufacturing process including the steps of simultaneously providing a plurality of holes in the peripheral circuit region selectively through a resist pattern; and forming bipolar transistors with characteristics different from each other at the locations of these plurality of holes. In this case, preferably, in manufacturing the memory circuit region and the bipolar transistors in the peripheral circuit region, manufacturing steps other than the hole forming step are also performed as concurrently as possible.

The present invention is also applicable to a manufacturing process including the steps of providing different holes selectively in the insulating film through resist patterns in different manufacturing steps in the peripheral circuit region, and forming bipolar transistors with characteristics different from each other at the locations of these different holes. In this case, preferably, in manufacturing the semiconductor memory circuit region and the bipolar transistors in the peripheral circuit region, manufacturing steps other than the hole forming step are also performed as concurrently and simultaneously as possible.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 3(a) to 3(c) are graphs of profiles of impurity concentration in a semiconductor device.

FIGS. 9(a) and 9(b) illustrate steps of the manufacturing process for a semiconductor device according to the first embodiment of the present invention.

FIGS. 17(a) to 17(c) show steps of the manufacturing process for semiconductor device according to a fifth embodiment of the present invention.

FIG. 25 is a table illustrating the manufacturing process for semiconductor device according to the first embodiment of the present invention.

FIG. 26 is a table illustrating the manufacturing processes for semiconductor device according to the first, second and third embodiments of the present invention.

FIG. 27 is a table illustrating the manufacturing processes for semiconductor device according to the sixth, seventh and eighth embodiments of the present invention.

FIG. 28 is a table illustrating the manufacturing processes for semiconductor device according to the ninth, tenth and eleventh embodiments of the present invention.

DETAILED DESCRIPTION OF THE PREFERRED EMBODIMENTS

Figure 1:
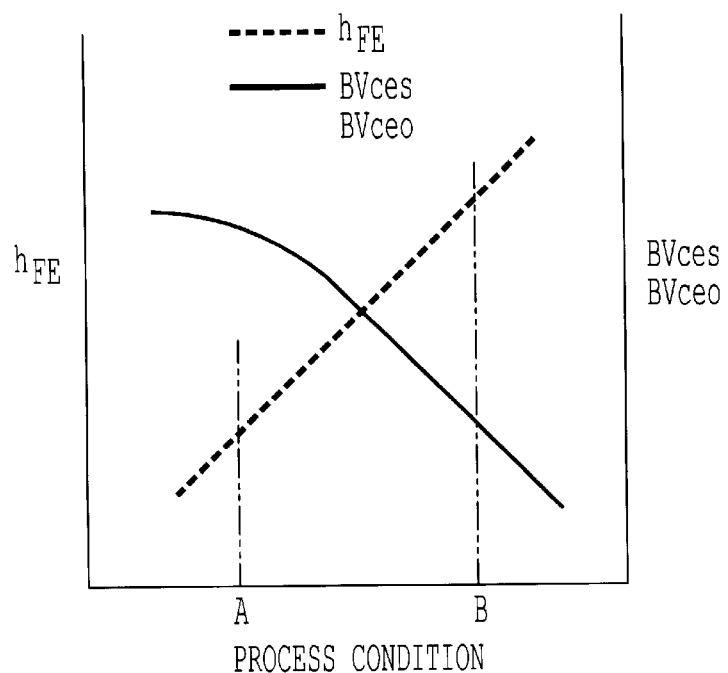
FIG. 1 is a graph illustrating the relationship between conditions of manufacturing process for semiconductor device and its characteristics.
Figure 2:
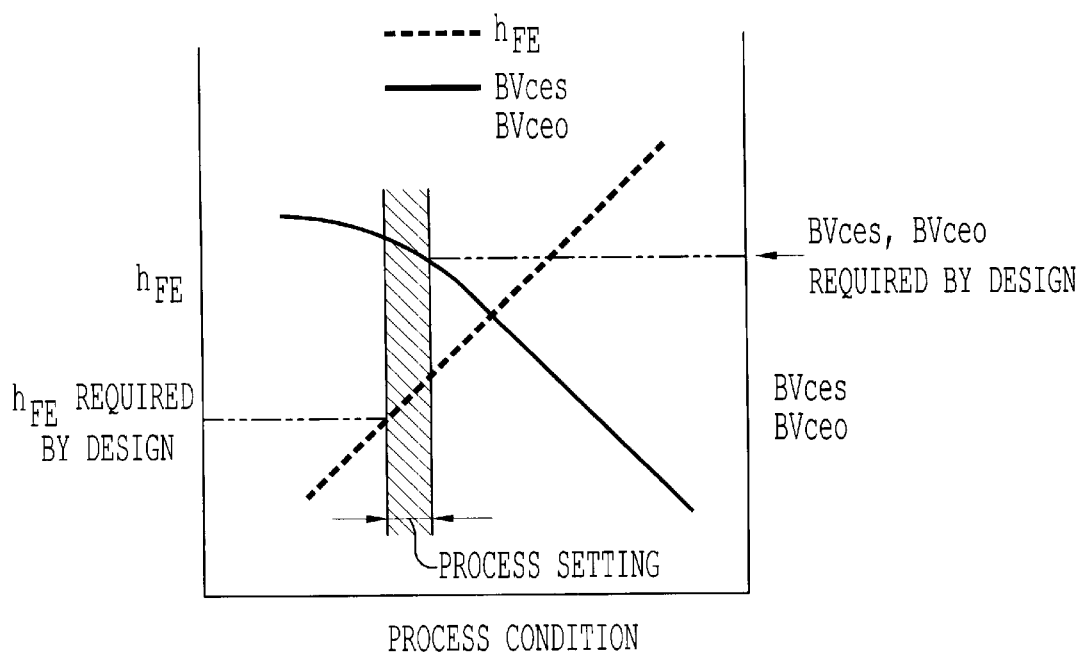
FIG. 2 is a graph illustrating setting of manufacturing 9 process conditions for a semiconductor device.

Referring now to the drawings, wherein like reference numerals designate identical or corresponding parts throughout the several views, first through twelfth embodiments of the present invention are next described.

First Embodiment

A static random access memory (SRAM) in a semiconductor memory circuit is taken as an example of a semiconductor device for the description and explanation of this invention. First, the construction of a SRAM and its conventional manufacturing process is described.

Figure 4:
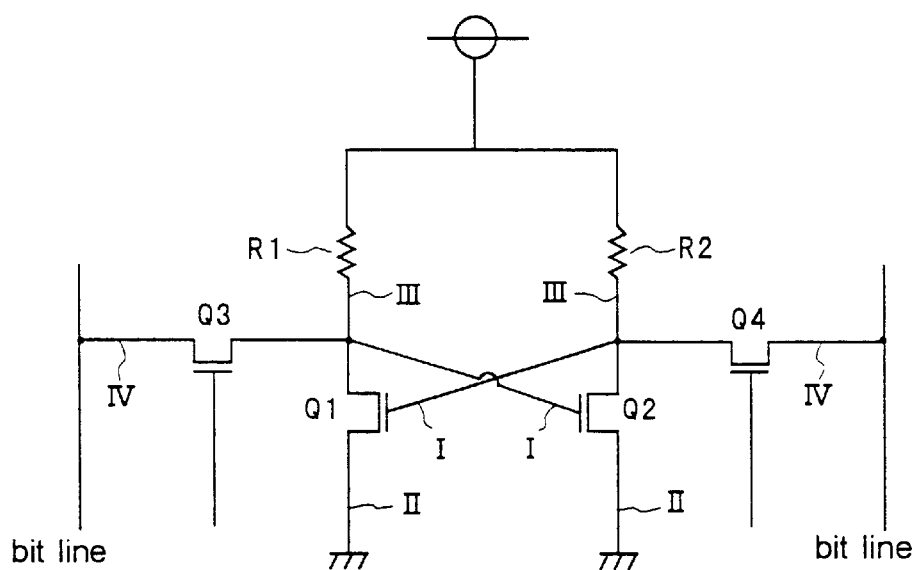
FIG. 4 is a circuit diagram of an equivalent circuit for a memory cell in an SRAM.

FIG. 4 is an equivalent circuit diagram of a memory cell in the SRAM. As shown in the figure, the memory cell in the SRAM comprises driver transistors Q1 and Q2, access transistors Q3 and Q4 and resistors R1 and R2. Symbols I–IV in the drawing correspond to the holes formed in the manufacturing process of a memory cell region to be described later, and indicate the corresponding positions in the circuit.

Figure 5A:
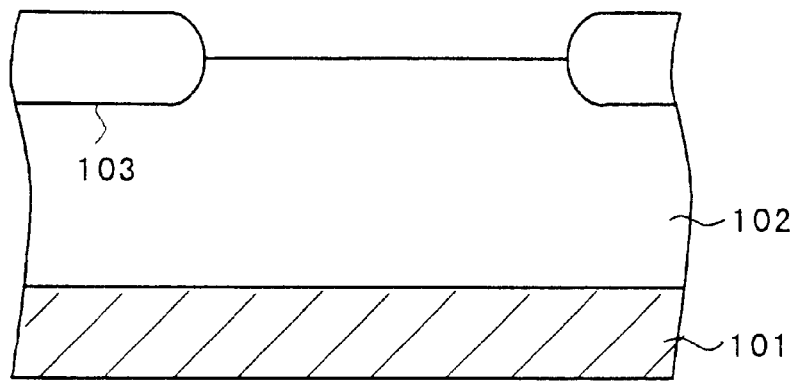
FIGS. 5(a) to 5(c), 6(a) to 6(c) and 7(a) to 7(c) show steps of a manufacturing process for a semiconductor device according to a first embodiment of the present invention.

FIGS. 5(a) through 9(b) are illustrations of the manufacturing process for such a SRAM, next described. As shown in FIG. 5(a), a p-type well 102 and an isolation oxide film 103 are formed on a p-type substrate 101. In this embodiment, the p-type well 102 may be formed by thermal diffusion or ion implantation. There may be an n-type buried layer to decrease soft errors between the p-type substrate 101 and the p-type well 102.

Figure 5B:
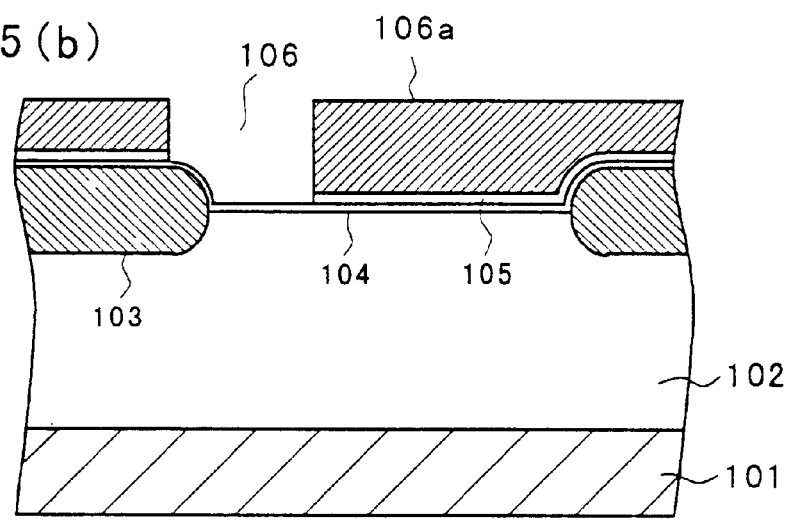

Then, as shown in FIG. 5(b), a gate oxide film 104, polysilicon 105 for a gate electrode, and a resist pattern 106a are formed, and then a gate contact hole 106 (hole I) is formed for connecting the gate electrode of the driver transistor Q1 (or Q2) and the drain region of the driver transistor Q2 (or Q1).

Figure 5C:
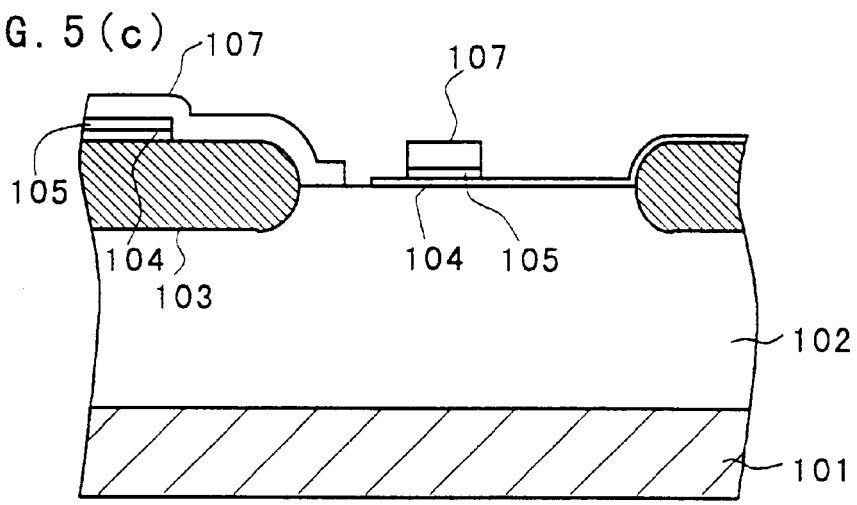

Thereafter, as shown in FIG. 5(c), the resist 106a is removed, and then the polysilicon (polycide) 107 is formed for forming the gate electrode and patterning of the gate electrode is performed.

Figure 6A:
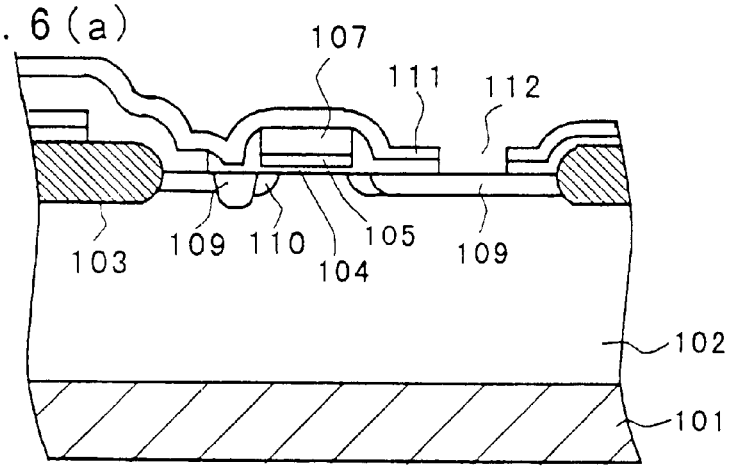

Then, as shown in FIG. 6(a), a source and drain region 109 and an n− region 110 are formed, and then an inter-layer insulating film 111 is formed. Then, a first polycontact hole 112 (hole II) is formed as an opening for leading out a conductor from the source region of the driver transistor.

Figure 6B:
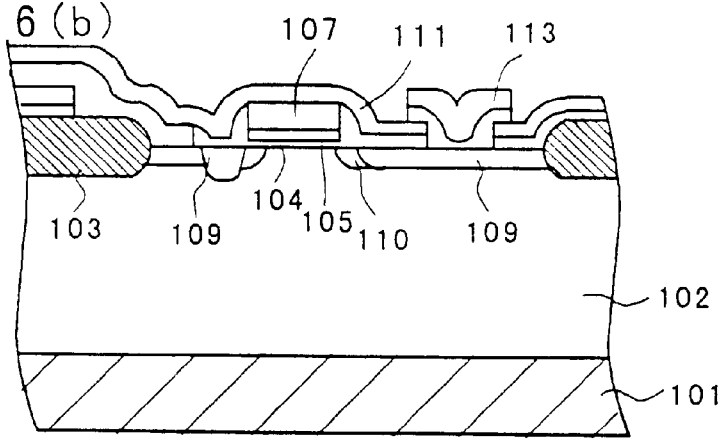
Figure 6C:
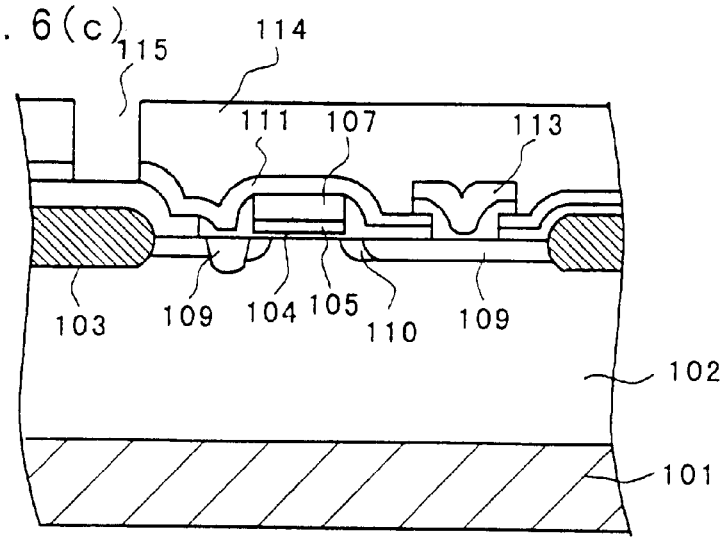
Figure 7A:
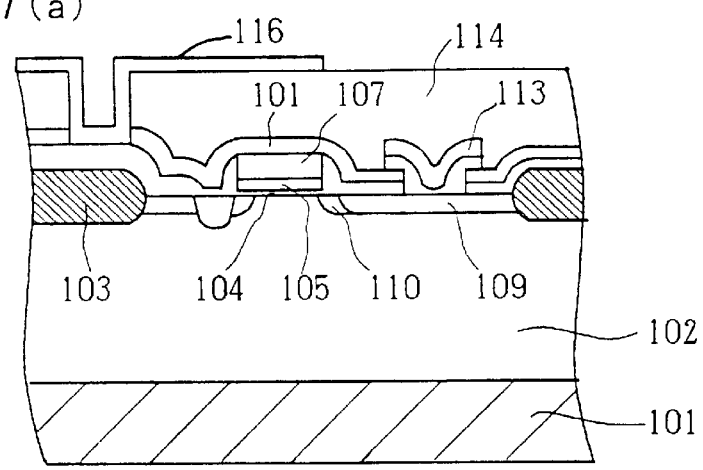

Then, as shown in FIG. 6(b), a polycide layer 113 serving as a lead-out pad and ground wiring is formed. Then, as shown in FIG. 6(c), an inter-layer insulating film 114 is formed. Then, a second polycontact hole 115 (hole III) is formed for connecting the gate electrode of the driver transistor and a high resistance. Then, as shown in FIG. 7(a), a polysilicon film 116 serving as the high resistance is formed.

Figure 7B:
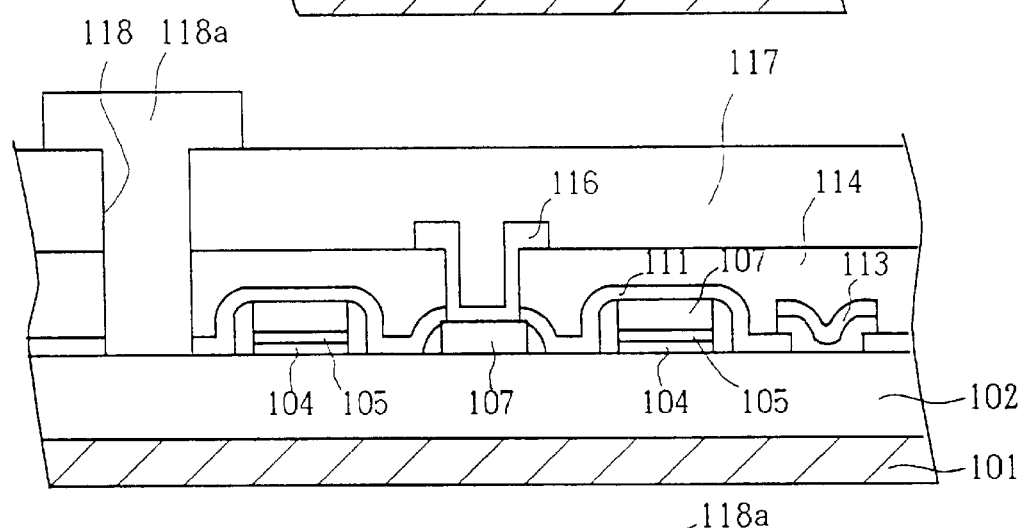
Figure 7C:
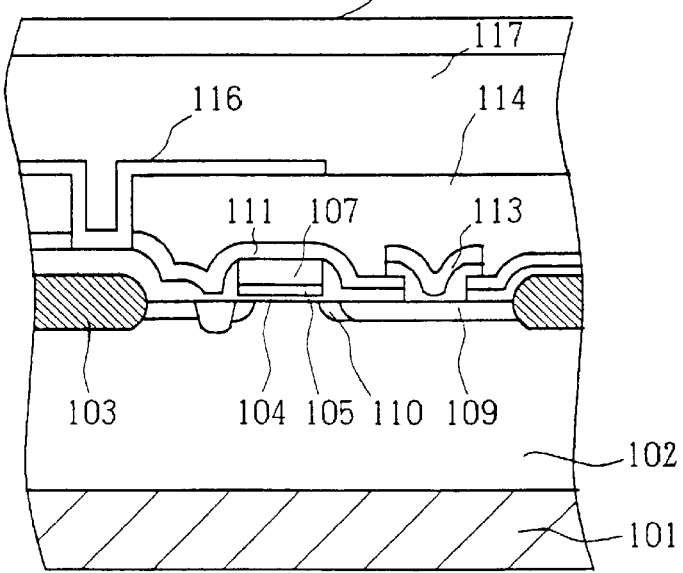

Thereafter, as shown in FIG. 7(b), an inter-layer insulating film 117 is formed. Then, a first contact hole 118 (hole IV) is formed for connecting the drain region of the access transistor and a bit line. Then, as shown in FIGS. 7(b) and 7(c), a wiring layer 118a serving as wiring and a bit line is formed. FIG. 7(b) shows a section partially different from the other figures.

As described above, in manufacturing the MOS memory cells of the semiconductor memory region particularly the SRAM, four independent holes, that is, the gate contact hole 106 (hole I), the first polycontact hole 112 (hole II), the second polycontact hole 115 (hole III), and the first contact hole (hole IV) are selectively formed in the insulating film through the resist pattern.

In parallel to manufacturing the semiconductor memory in the memory region, the bipolar transistors are manufactured in the peripheral circuit region and/or in the memory region. Then, concurrently with one manufacturing step of selectively providing the holes in the semiconductor memory region in the insulating film through the resist pattern, also in the peripheral circuit region, a plurality of holes are simultaneously provided in the insulating film through the resist pattern, whereby the bipolar transistors with characteristics different from each other are formed.

In addition, in correspondence to a plurality of different manufacturing steps for selectively providing the holes in the insulating film in the semiconductor memory region through the resist pattern, also in the peripheral circuit region, a plurality of holes are provided in the insulating film through the resist pattern, whereby the bipolar transistors with characteristics different from each other are formed in the region of the holes in the different manufacturing steps.

As described, the holes in the peripheral circuit region for manufacturing the bipolar transistors are formed concurrently and commonly with the formation of any one of the four types of holes in the memory region to manufacture the bipolar transistors with characteristics different from each other.

In the following, the manufacturing process for bipolar transistors to be formed in the peripheral circuit region and/or in the memory region is described in correspondence to the steps for forming each hole in the memory cell region.

(I) Manufacturing Process of a Bipolar Transistor in correspondence to a Gate Contact Hole (Hole I)

Figure 8A:
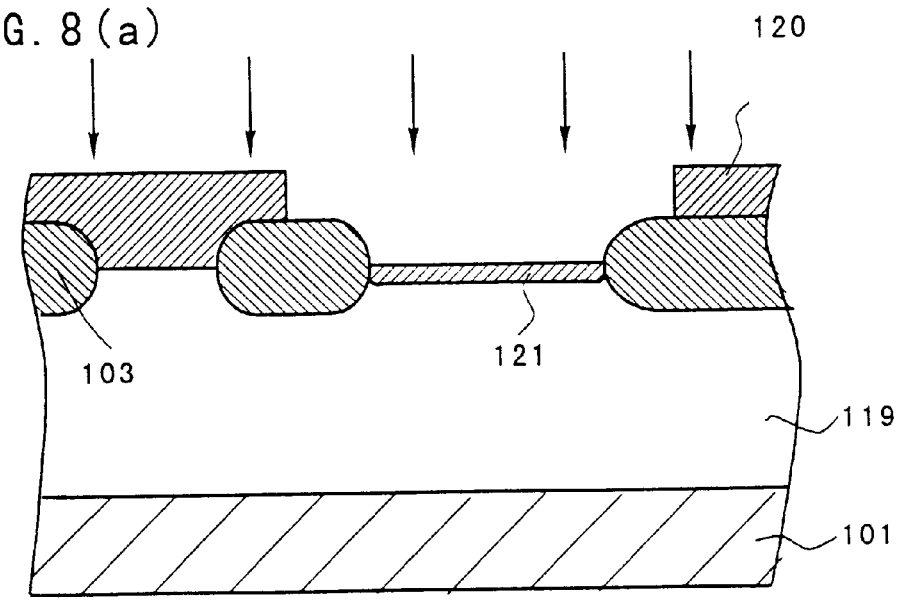
FIGS. 8(a) to 8(c) illustrate steps of the manufacturing process for a semiconductor device according to the first embodiment of the present invention.
Figure 8B:
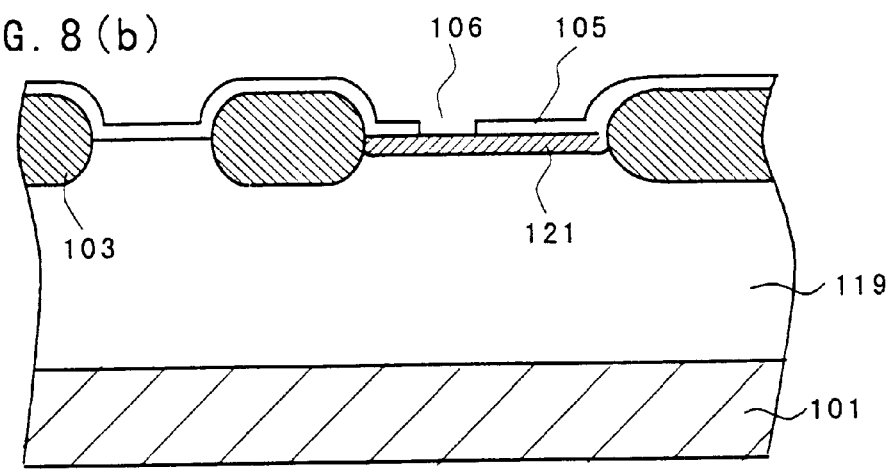
Figure 8C:
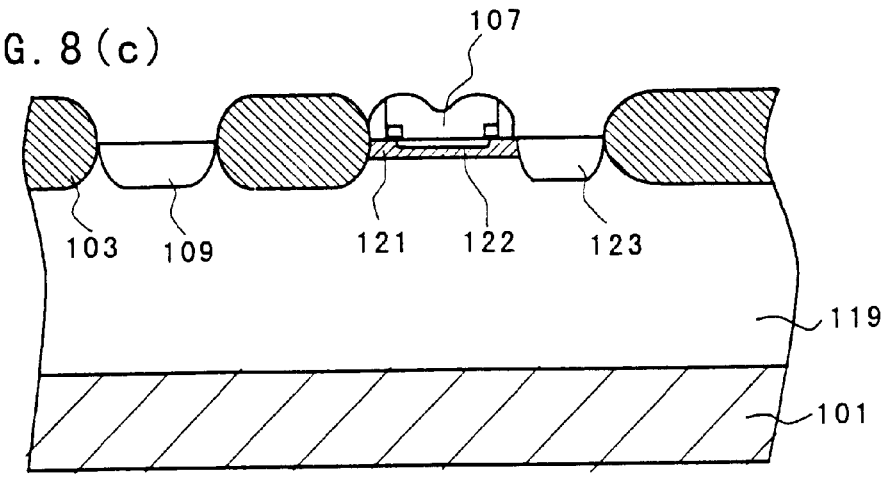

FIGS. 8(a)–8(c) show steps of the manufacturing process of a bipolar transistor according to the first embodiment of the present invention. First, as shown in FIG. 8(a), an n-type well 119 and an isolation oxide film 103 are formed on a p-type substrate 101. The n-type well 119 may be formed by either thermal diffusion or ion implantation. In this embodiment, a bipolar transistor is formed in the n-type well 119. However, the bipolar transistor maybe formed in an epitaxial layer or an n+ buried layer.

Then, a resist pattern 120 is formed except on an area for base forming, and an intrinsic base (link base) layer 121 is formed by ion implantation of p-type impurities such as boron B.

Subsequently, as shown in FIG. 8(b), a polysilicon 105 for a gate electrode is formed, and then, an opening 106 of an emitter forming region is formed concurrently when a gate contact hole 106 (hole I) is opened in a memory cell region. Then, n– or p-type impurities may be implanted in the hole section.

Subsequently, as shown in FIG. 8(c), an emitter electrode 107 is formed with polysilicon (polycide) used for the gate electrode. The intrinsic base 121 may be formed by ion implantation after the opening 106 is formed. In addition, an emitter 122 may be formed by ion implantation after formation of the opening 106, or may be formed by impurity diffusion from the polycide 107.

Then, at the same time when an n+ SID (source/drain) is formed in a CMOS process, a collector lead-out section 109 is formed in the peripheral circuit region. At the same time when a p+ SID (source/drain) is implanted, a base lead-out section 123 is formed.

Then FIG. 9(a) shows partial manufacturing steps of a MOS transistor in the CMOS process together with a partial manufacturing process of the bipolar transistor shown in FIG. 8(a). As shown in FIG. 9(a), an NMOS transistor Q5 and a PMOS transistor Q6 are formed in the CMOS process. As shown in FIG. 9(a), in forming the NMOS transistor Q5, ion implantation is performed to adjust the threshold voltage through a resist pattern 120.

On the other hand, in a bipolar transistor T1 shown in FIG. 9(b), ion implantation is performed to form a base 121 through the resist pattern 120. In this manufacturing step, both resists may be concurrently and commonly formed. With such approach, in this case, the bipolar transistors can be formed with the same number of masks as in the CMOS flow for SRAM.

(II) Manufacturing Process of a Bipolar Transistor in Correspondence to Formation of a First Polycontact Hole (Hole II)

Figure 10A:
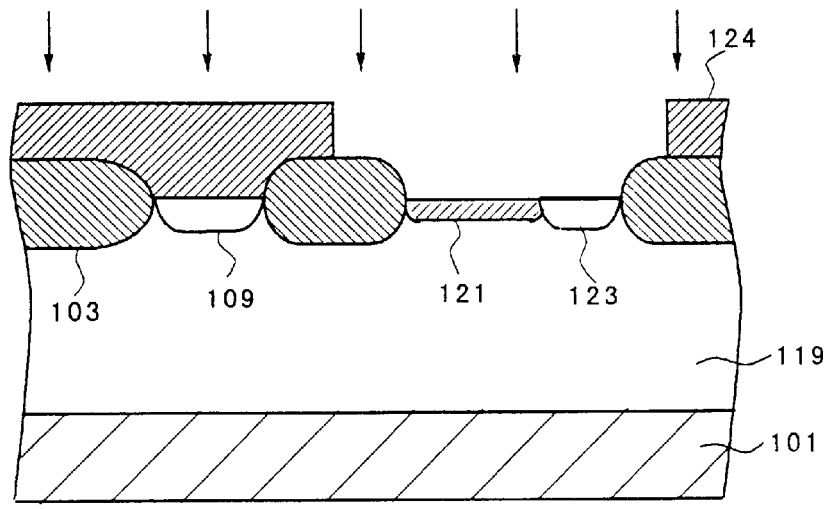
FIGS. 10(a) to 10(c) illustrate steps of the manufacturing process for a semiconductor device according to the first embodiment of the present invention.
Figure 10B:
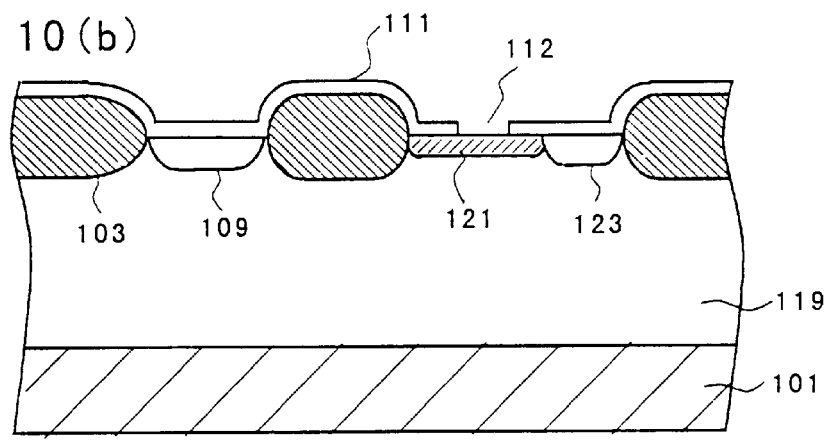
Figure 10C:
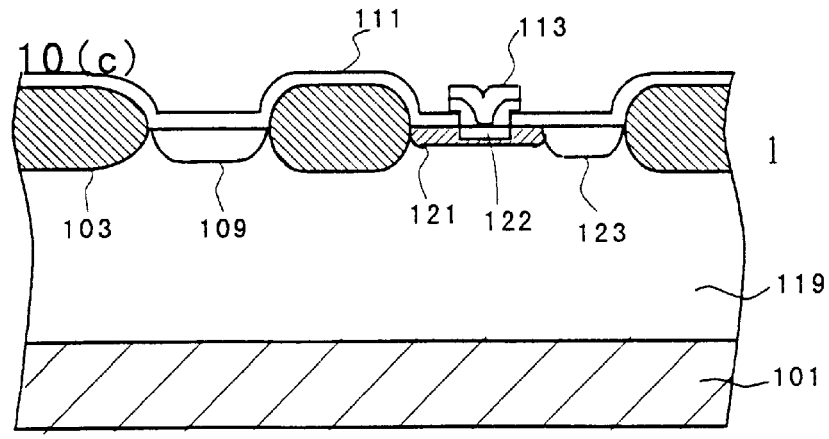

FIGS. 10(a) through 10(c) show steps of the manufacturing process for another bipolar transistor according to the first embodiment of the present invention. First, as shown in FIG. 10(a), an n-type well 119 and an isolation oxide film 103 are formed on a p-type substrate 101. The n-type well 119 may be formed by either thermal diffusion or ion implantation. In this embodiment, a bipolar transistor is formed in the n-type well 119. However, the bipolar transistors may be formed in an epitaxial layer or an n+ buried layer.

Then, after a collector lead-out section 109 and a base lead-out section 123 are formed, a resist pattern 124 is formed except on an area for base forming and an intrinsic base (link base) layer 121 is formed by ion implantation of p-type impurities such as boron B.

Subsequently, as shown in FIG. 10(b), an inter-layer insulating film 111 is formed, and then, an opening 112 of an emitter forming region is formed concurrently when a first polycontact hole (hole II) is opened in the memory cell region. Then, n– or p-type impurities may be implanted in the hole section. Subsequently, as shown in FIG. 10(c), an emitter electrode 113 is formed with polycide used for the ground wiring. In this case, the intrinsic base 121 may be formed by ion implantation after formation of the opening 112. Further, an emitter 122 may be formed by ion implantation after formation of the opening 112, or may be formed by impurity diffusion from the polycide 113.

Figure 11A:
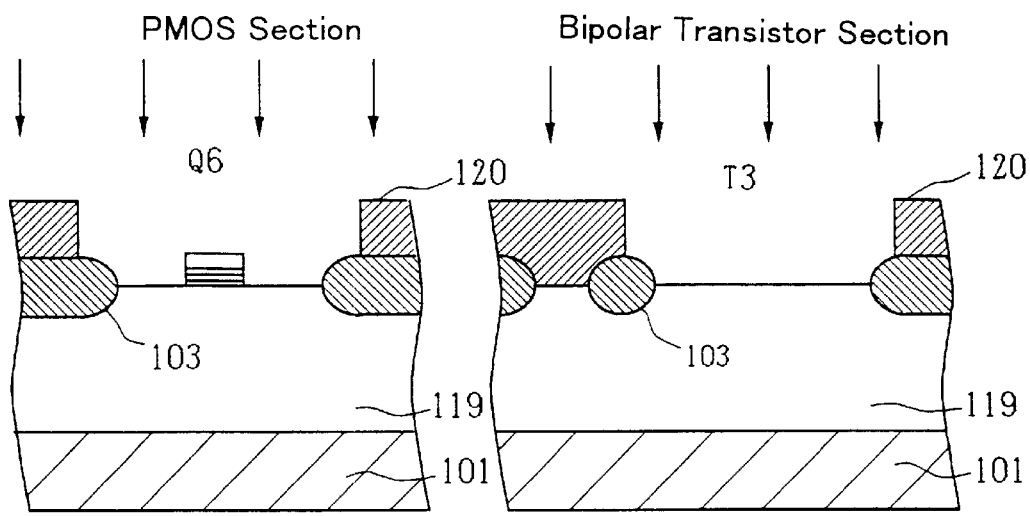
FIGS. 11(a) and 11(b) illustrate steps of the manufacturing process for a semiconductor device according to the first embodiment of the present invention.
Figure 11B:
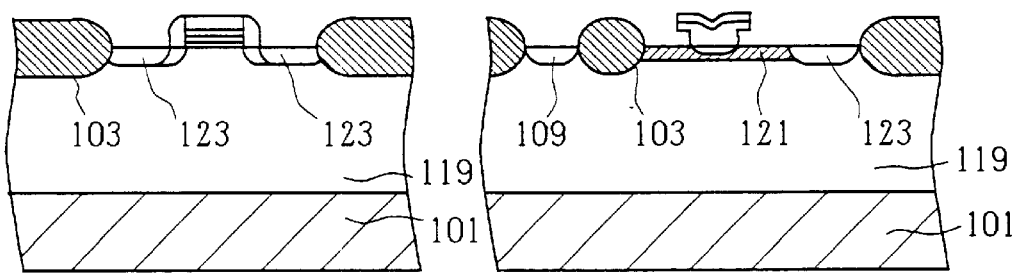

Furthermore, FIG. 11 shows partial manufacturing steps for a transistor in the CMOS process together with those for the bipolar transistor shown in FIG. 8(a). As shown in FIGS. 11(a) and 11(b), in the formation of a PMOS transistor Q6 in the CMOS process, p– ion implantation is performed through the resist pattern 120. For the bipolar transistor T3 shown in FIGS. 11(a) and 11(b), ions are implanted through the resist pattern 120 to form a base 121. In the manufacturing step, both resists may be concurrently and commonly formed. With such approach, in this case, the bipolar transistor can be formed with the same number of masks as in the CMOS flow for SRAM.

As is described above for FIGS. 9(a) and 9(b), in this embodiment also, the resist pattern 124 in the manufacture of the bipolar transistor may be commonly formed in the same manufacturing step of the resist pattern for implantation for adjusting the threshold voltage in the manufacture of an NMOS transistor. With such approach, in this case, the bipolar transistor can be formed with the same number of masks as in the CMOS flow.

(III) Manufacturing Process for a Bipolar Transistor in Correspondence to Formation of a Second Polycontact Hole (Hole III)

Figure 12A:
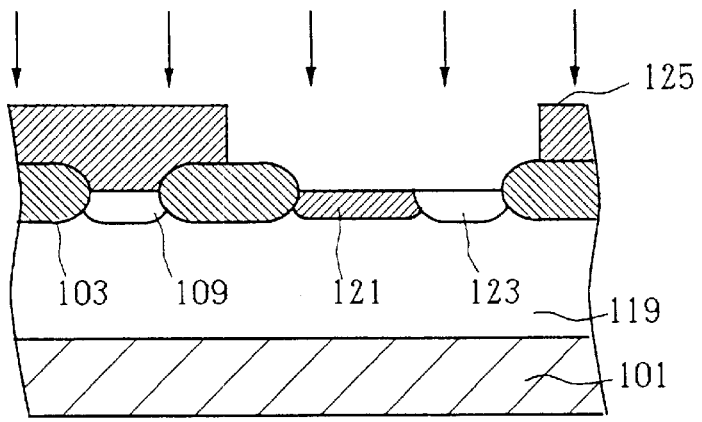
FIGS. 12(a) to 12(c) illustrate steps of the manufacturing process for a semiconductor device according to the first embodiment of the present invention.
Figure 12B:
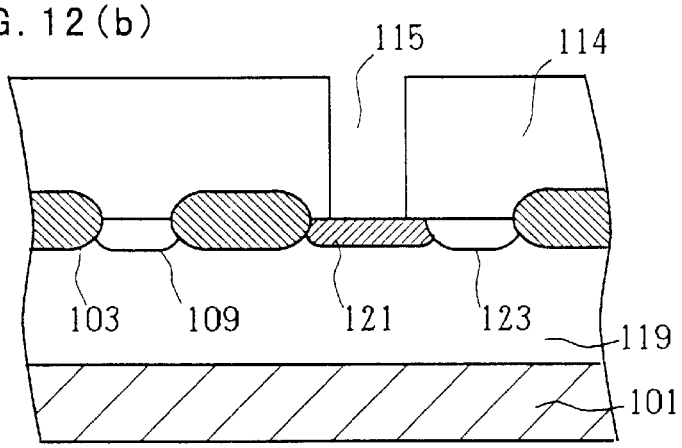
Figure 12C:
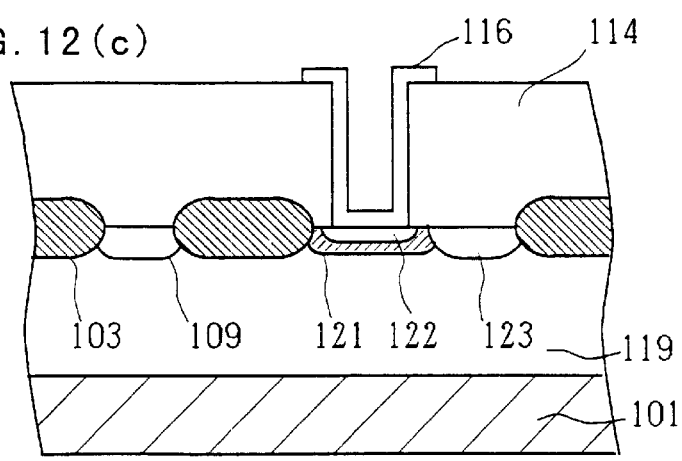

FIGS. 12(a) through 12(c) show a partial manufacturing process for another bipolar transistor according to the first embodiment of the present invention. The manufacturing process is described herein. First, as shown in FIG. 12 (a), an n-type well 119 and an isolation oxide film 103 are formed on a p-type substrate 101. The n-type well 119 may be formed by either thermal diffusion or ion implantation. In this embodiment, a bipolar transistor is formed in the n-type well 2. However, the bipolar transistor may be formed in an epitaxial layer or an n+ buried layer.

Then, after a collector lead-out section 109 and a base lead-out section 123 are formed, a resist pattern 125 is formed except on an area for base forming, and an intrinsic base (link base) layer 121 is formed by ion implantation of p-type impurities such as boron B.

Subsequently, as shown in FIG. 12(b), an inter-layer insulating film 114 is formed, and then, an opening 115 of an emitter forming region is formed concurrently when a second polycontact hole 115 (hole III) is opened in the memory cell region. Then, n- or p-type impurities may be implanted in the hole section.

Subsequently, as shown in FIG. 12(c), an emitter electrode 116 is formed with polysilicon used for high resistance and the ground wiring. In this case, the intrinsic base 121 may be formed by ion implantation after formation of the opening 115. Further, an emitter 122 may be formed by ion implantation after formation of the opening 115, or may be formed by impurity diffusion from the polysilicon 116.

As is described above for FIGS. 9(a)–9(b) and 11(a)–11(b), in this embodiment also, the resist pattern 125 in the manufacture of the bipolar transistor may be commonly formed in the same manufacturing step of the resist pattern for implantation for adjusting the threshold voltage in the manufacture of an NMOS transistor, or of the resist pattern for p- implantation for a PMOS transistor. With such approach, in this case, the bipolar transistor can be formed with the same number of masks as in the CMOS flow for SRAM.

(IV) Manufacturing Process for a Bipolar Transistor in Correspondence to Formation of a First Contact Hole (Hole IV).

Figure 13A:
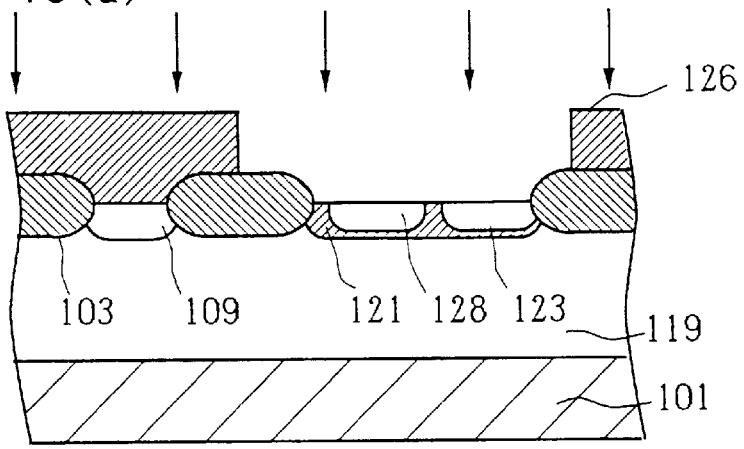
FIGS. 13(a) to 13(c) illustrate steps of the manufacturing process for a semiconductor device according to the first embodiment of the present invention.
Figure 13B:
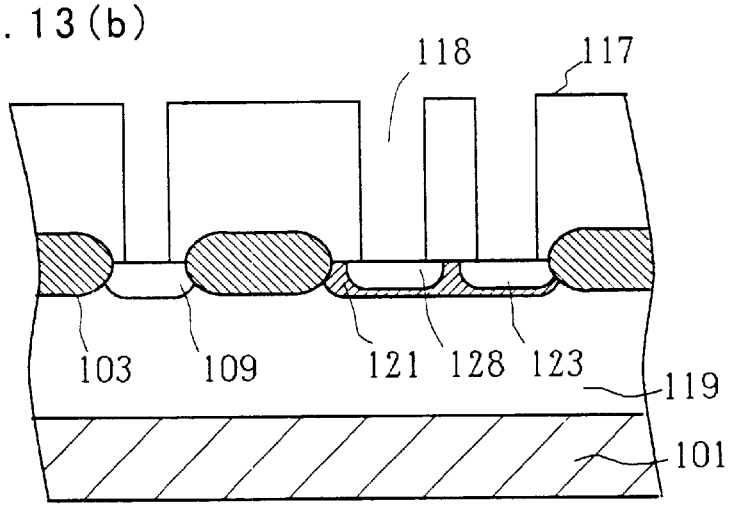
Figure 13C:
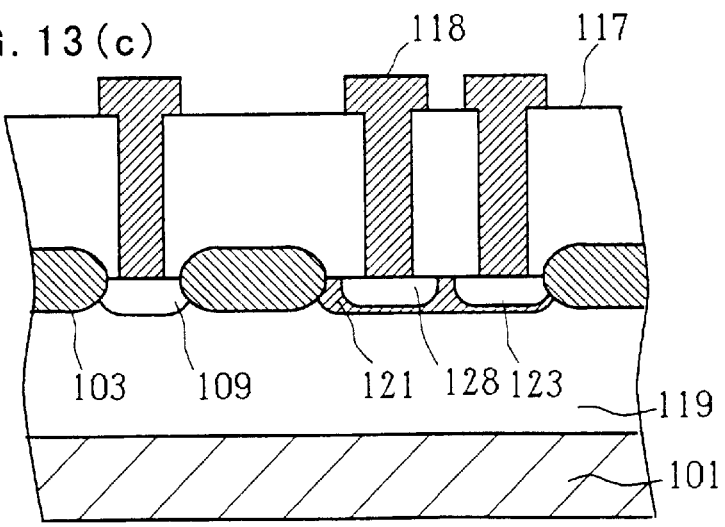

FIGS. 13(a) through 13(c) show steps of the manufacturing process for another bipolar transistor according to the first embodiment of the present invention. First, as shown in FIG. 13(a), an n-type well 119 and an isolation oxide film 103 are formed on a p-type substrate 101. The n-type well 119 may be formed by either thermal diffusion or ion implantation. In this embodiment, a bipolar transistor is formed in the n-type well 119. However, the bipolar transistor may be formed in an epitaxial layer or an n+ buried layer.

Then, when an n+ S/D (source/drain) is formed in the memory cell region, a collector lead-out section 109 and an emitter 128 of this embodiment are formed. In addition, when a p+ S/D (source/drain) is formed in the peripheral circuit region, a base lead-out section 123 of this embodiment is formed.

Then, a resist pattern 126 is formed except an area for base forming and an intrinsic base (link base) layer 121 is formed by ion implantation of p-type impurities such as boron B.

Thereafter, as shown in FIG. 13(b), an inter-layer insulating film 117 is formed, and then concurrently when a first contact hole 118 (hole IV) is formed in the memory cell region, respective contact holes 118 for an emitter 128, a base lead-out section 123 and a collector 109 are formed. Further, in forming the contact holes 118, n- or p-type impurities may be implanted through these holes. Then, as shown in FIG. 13(c), a wiring layer 118a is formed including in the contact holes 118.

As is described above for FIGS. 9(a)–9(b) and 11(a)–11(b), in this embodiment also, the resist pattern 126 in the manufacture of the bipolar transistor may be commonly formed in the same manufacturing step of the resist pattern for implantation for adjusting the threshold voltage in the manufacture of an NMOS transistor, or of the resist pattern for p- implantation for a PMOS transistor. With such approach, in this case, the bipolar transistor can be formed with the same number of masks as in the CMOS flow.

FIG. 25 is a table comparing the manufacturing process for the SRAM of FIG. 5 described above with the manufacturing process for bipolar transistors of FIGS. 8(a)–8(c), 10(a)–10(c), 12(a)–12(c), and 13(a)–13(c). FIG. 25 shows the relationship between the hole forming step for the SRAM and that for the bipolar transistors, and the fact that other steps are arranged to be performed as concurrently as possible to minimize the number of steps.

Thus, in the SRAM process flow, the bipolar transistors can be formed in the steps for forming each contact. In the above embodiments, there are shown processes of forming bipolar transistors in a peripheral circuit. However, similar processes are applicable to manufacture bipolar transistors in a memory circuit region. When necessary, p-type may be replaced by n-type, and vice versa. A detailed embodiment for forming a bipolar transistor in a memory circuit will be shown later.

Thus, there are several approaches for forming the bipolar transistors with different characteristics in the peripheral circuit region and/or in the memory region. First, there is an approach that a plurality of holes are opened in the peripheral circuit region and/or in the memory region concurrently with a hole forming step in the memory cell region, and the bipolar transistors with characteristics different from each other are concurrently formed in the respective hole area in the peripheral circuit region and/or in the memory region.

Then, there is another approach that holes are opened in a plurality of manufacturing steps for the peripheral circuit region and/or in the memory region corresponding to a plurality of hole forming steps in the memory cell region, and the bipolar transistors with characteristics different from each other are formed in the respective hole area in the peripheral circuit region and/or in the memory region. The profiles for the emitter, base or collector are varied by changing the implantation conditions or the like for each hole so that the bipolar transistors with different characteristics can be manufactured.

Furthermore, there is an approach that, even if the hole forming step for the peripheral circuit region is not performed concurrently with that for the memory cell region, any process for the formation of inter-layer insulating film, the ion implantation or the impurity diffusion is concurrently performed in the memory cell region and the peripheral circuit region.

The present invention is intended to control and attain a process condition with high breakdown voltage and low current amplification as shown at a point A in FIG. 1, or a process condition with high current amplification and low breakdown voltage as shown at a point B in FIG. 1 based on the relationship between the current amplification (hfe) and breakdown voltage (BVces, BVceo) shown in FIG. 1. Thus, in a semiconductor device, bipolar transistors having characteristics suitable for respective circuits are manufactured. In this case, as many types of characteristics as required may be provided for the bipolar transistors.

As for the process for manufacturing the bipolar transistors with various types of characteristics, profiles of impurity concentration are controlled besides variation of size. For example, as shown in FIG. 3(a), two or more types of bipolar transistors can be formed by changing the profile in the emitter region. Alternatively, as shown in FIG. 3(b), two or more types of bipolar transistors can be formed by changing the profile in the base region. Further, as shown in FIG. 3(c), two or more types of bipolar transistors may be formed by changing the profile in the collector region.

In the embodiments as explained above, npn bipolar transistors are formed in a peripheral circuit region and/or in a memory circuit region. However pnp bipolar transistors may also be formed. Further, transistors of both npn and pnp-type may be formed in the same manufacturing process in a peripheral circuit region and/or in a memory circuit region. Now, individual manufacturing processes for such bipolar transistors with different characteristics are described in the following.

Second Embodiment

Figure 14A:
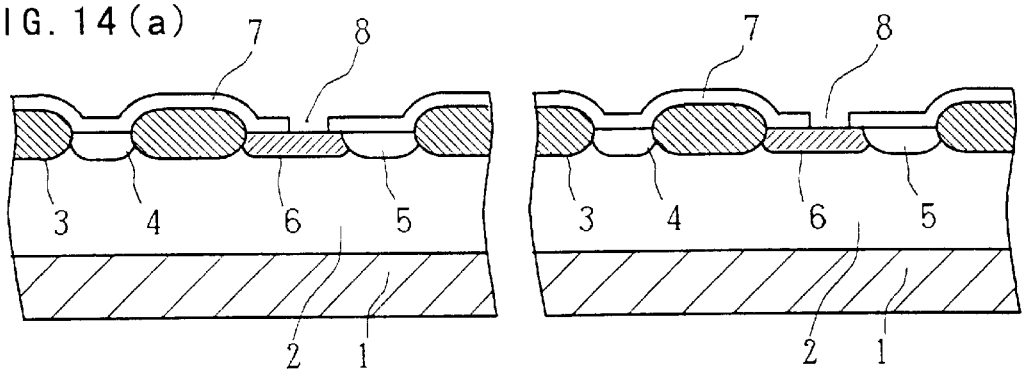
FIGS. 14(a) to 14(c) show steps of the manufacturing process for a semiconductor device according to a second embodiment of the present invention.
Figure 14B:
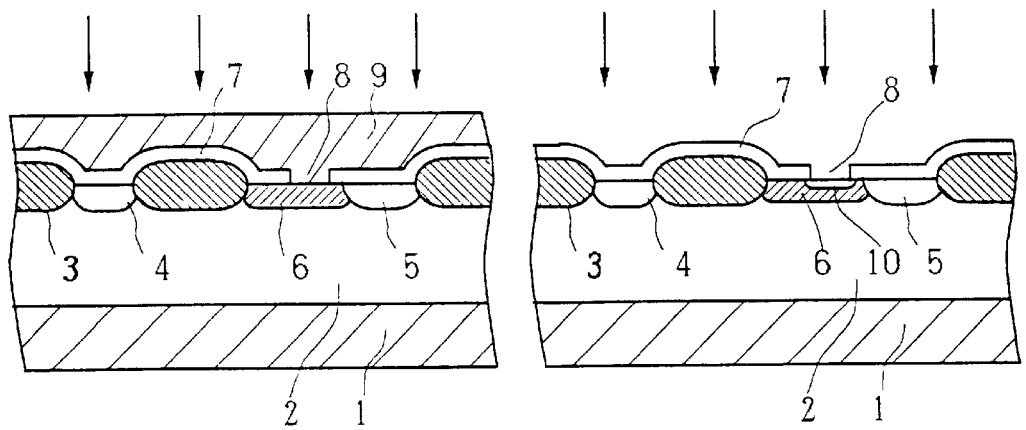
Figure 14C:
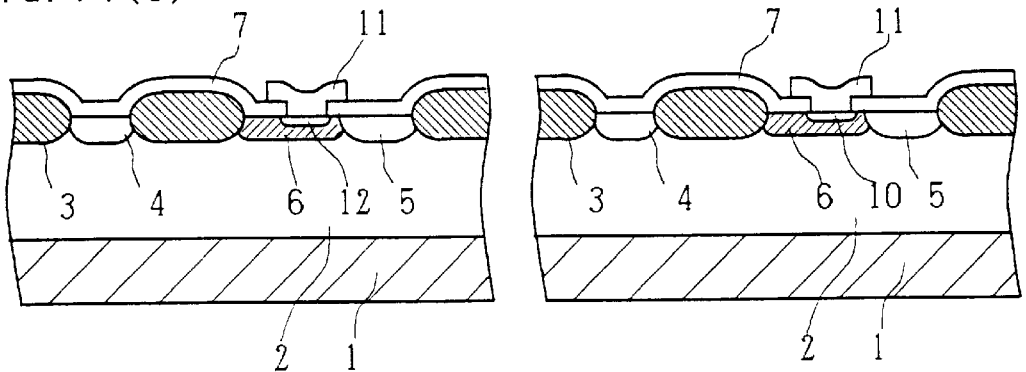

FIGS. 14(a) through 14(c) show the manufacturing process for bipolar transistors according to the second embodiment of the present invention. First, as shown in FIG. 14(a), for both transistor regions A and B, an n-type well 2 and an isolation oxide film 3 are formed on a p-type substrate 1. The n-type well 2 may be formed by thermal diffusion or ion implantation. In this embodiment, a bipolar transistor is formed in the n-type well 2. However, the bipolar transistor may be formed in an epitaxial layer or an n+ buried layer.

Thereafter, a collector lead-out section 4, a base lead-out section 5 and an intrinsic base layer or a link base layer 6 are formed in the respective regions A and B. Then, an interlayer insulating film 7 is formed, and opening 8 for emitter region is formed.

Subsequently, as shown in FIG. 14(b), a resist pattern 9 is formed on the region A to obtain a bipolar transistor A with relatively low concentration in the emitter, hence to obtain high breakdown voltage and low (hfe). On the other hand, in the region B, an emitter 10 is formed by implanting ions of n-type impurities such as arsenic As.

Then, as shown in FIG. 14(c), the resist pattern 9 is removed from the region A, and emitter electrodes 11 are formed on both regions A and B. In this case, the emitter electrode 11 may be polysilicon or polycide. Then, an emitter 12 is formed on the region A. The emitter 12 may be formed by ion implantation or by impurity diffusion from the emitter electrode 11. The emitter 10 is already formed on the region B.

With such manufacturing process, since the emitter 10 on the transistor B has higher concentration than the emitter 12 on the transistor A by ion implantation, the bipolar transistors with two types of characteristics are manufactured. According to such manufacturing process, the bipolar transistors with different characteristics can be simultaneously and concurrently manufactured in the common manufacturing processes.

Third Embodiment

Figure 15A:
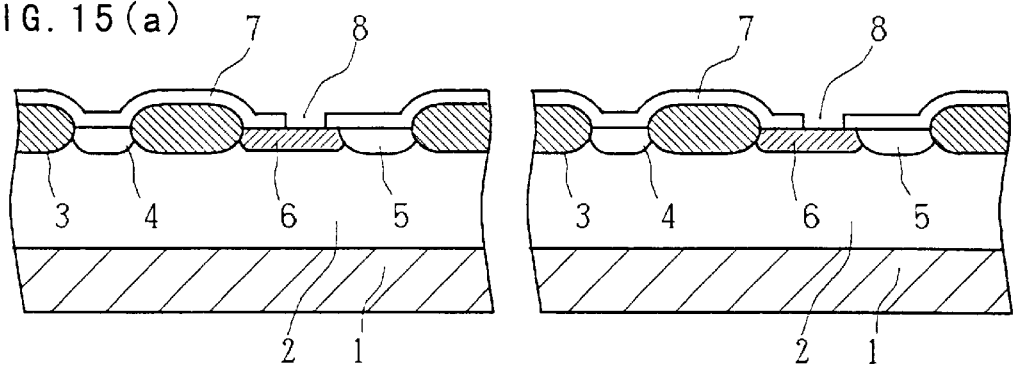
FIGS. 15(a) to 15(c) show steps of the manufacturing process for a semiconductor device according to a third embodiment of the present invention.
Figure 15B:
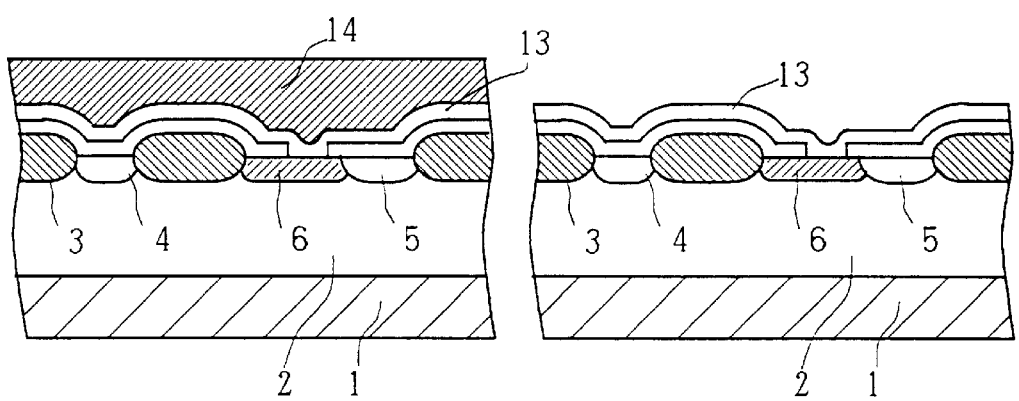
Figure 15C:
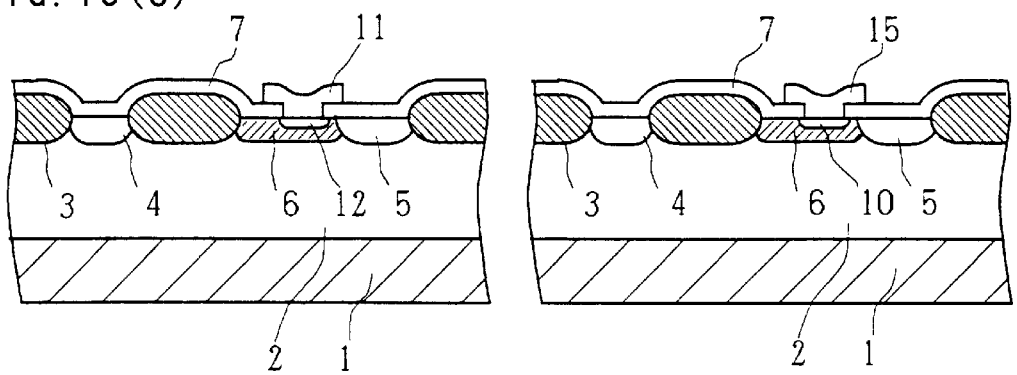

FIGS. 15(a) through 15(c) show the manufacturing process for bipolar transistors according to the third embodiment of the present invention. First, as shown in FIG. 15(a), for both transistor regions C and D, an n-type well 2 and an isolation oxide film 3 are formed on a p-type substrate 1. The n-type well 2 may be formed by thermal diffusion or ion implantation. In this embodiment, a bipolar transistor is formed in the n-type well 2. However, the bipolar transistor may be formed in an epitaxial layer or an n+ buried layer.

Thereafter, a collector lead-out section 4, a base lead-out section 5 and an intrinsic base layer or a link base layer 6 are formed in the respective regions C and D. Then, an interlayer insulating film 7 is formed, and an opening 8 for emitter region is formed.

Subsequently, as shown in FIG. 15(b), a polysilicon or polycide layer 13 is formed on both regions C and D as an emitting electrode forming layer. Then, a resist pattern 14 is formed on the region C. When the emitter electrode is made with polycide, the resist pattern may be formed after underlying polysilicon is formed or after polycide is formed. Then, ions of n-type-impurities such as arsenic As are implanted in the region D.

Subsequently, as shown in FIG. 15(c), the resist pattern on the region C is removed. Then an emitter electrode 11 and an emitter 12 are formed on the region C, and an emitter electrode 15 and an emitter 10 are formed on the region D. In this case, the emitter 12 on the region C may be formed by diffusion from the emitter electrode 11, or by ion implantation before the formation of the emitter electrode 11. The transistor C becomes a bipolar transistor with high concentration in the emitter, hence high breakdown voltage and low current amplification (hfe) is obtained.

In addition, since much diffusion from the emitter electrode 15 occurs in the transistor D by ion implantation, the emitter 10 of the transistor D has higher concentration than the emitter 12 of the transistor C so that the bipolar transistors C and D come to have different characteristics.

As described, according to this manufacturing process, the bipolar transistors C and D with different characteristics can be concurrently manufactured by the common manufacturing processes. This embodiment is characterized by that the process for manufacturing the emitter electrodes is different from other embodiments.

In FIG. 15(b), if the impurity concentration is previously changed by using doped polysilicon for the polysilicon 13, the concentration profile of the emitter diffused therefrom can be changed. This leads to obtaining bipolar transistors with different characteristics.

Fourth Embodiment

Figure 16A:
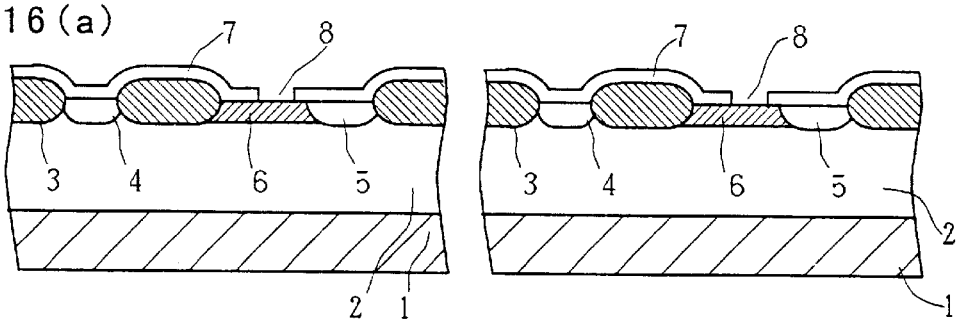
FIGS. 16(a) to 16(d) show steps of the manufacturing process for semiconductor device according to a fourth embodiment of the present invention.
Figure 16B:
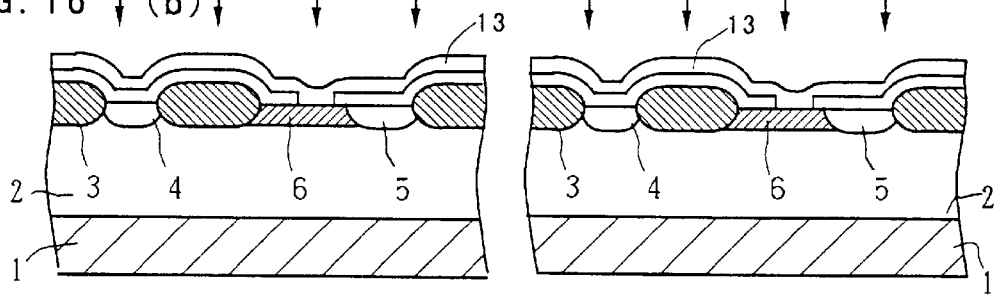
Figure 16C:
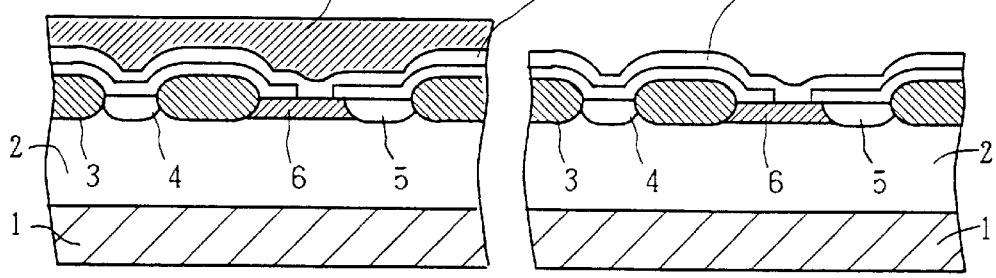

FIGS. 16(a) through 16(c) show the manufacturing process for bipolar transistors according to the fourth embodiment of the present invention. First, FIG. 16(a) shows the same configuration as FIG. 15(a). Then, in FIG. 16(b), non-doped polysilicon is employed as the polysilicon layer 13, and, after the polysilicon 13 is formed, n-type impurities such as arsenic As are implanted over the entire surfaces of regions E and F to make the concentration of polysilicon 13 at a desired value.

Figure 16D:
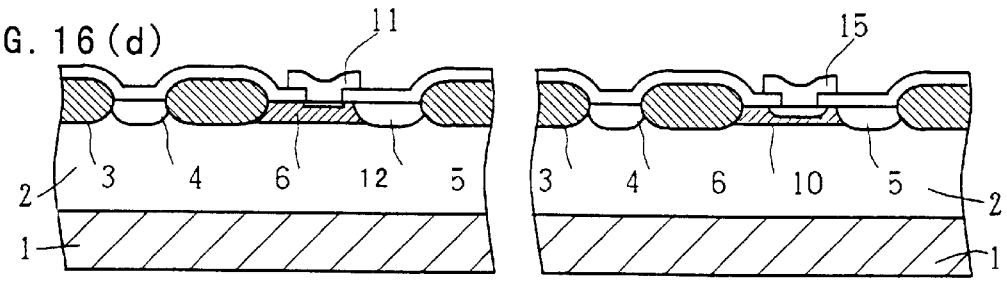

Then, as shown in FIG. 16(c), a resist pattern 14 is formed on the region E, and n-type impurities such as arsenic As are further implanted in the region F so that the concentration of the polysilicon 13 in the region F differs from that in the region E. The subsequent process of FIG. 16(d) is similar to FIG. 15(c) of the third embodiment. Thus, in this embodiment, the ion implantation is performed twice, and the emitter profile can be controlled for respective transistors so that the bipolar transistors with different characteristics can be manufactured.

Fifth embodiment

FIGS. 17(a) through 17(c) show the manufacturing process for bipolar transistors according to the fifth embodiment of the present invention. First, as shown in FIG. 17(a), for both transistor regions G and H, an n-type well 2 and an isolation oxide film 3 are formed on a p-type substrate 1. The n-type well 2 may be formed by thermal diffusion or ion implantation. In this embodiment, a bipolar transistor is formed in the n-type well 2. However, the bipolar transistor may be formed in an epitaxial layer or an n+ buried layer.

Thereafter, a collector lead-out section 4, a base lead-out section 5 and an intrinsic base layer or a link base layer 6 are formed in the respective regions G and H. Then, an interlayer insulating film 7 is formed, and an opening 8 for emitter region is formed only in the region of a bipolar transistor G.

Subsequently, as shown in FIG. 17(b), an emitter electrode 11 and an emitter 12 are formed in the region G. In this case, the emitter 12 may be formed by ion implantation or diffusion from the emitter electrode 11. Thus, after a bipolar transistor G is formed, inter-layer insulating films 16 are formed in both regions G and H, and then, an opening 17 of the emitter region of the other bipolar transistor H is formed.

Subsequently, as shown in FIG. 17(c), an emitter electrode 18 and an emitter 19 are formed in the transistor H. In this case, the emitter 19 may be formed by ion implantation or diffusion from the emitter electrode 18.

In this embodiment, the layers 11 and 18 serving as the emitter are formed in different processes respectively. When such process is employed, the respective emitters 12 and 19 are completely independently formed for both transistors G and H, and therefore two types of bipolar transistors with different characteristics can be obtained. FIG. 26 is a table comparing the manufacturing process for bipolar transistors of FIGS. 14(a)–14(c), 15(a)–15(c), and 17(a)–17(c) described above. FIG. 26 shows the relationship of the hole forming step for the bipolar transistors i.e. emitter openings, and the fact that other steps are arranged to be performed as concurrently as possible to minimize the number of steps.

Sixth embodiment

Figure 18A:
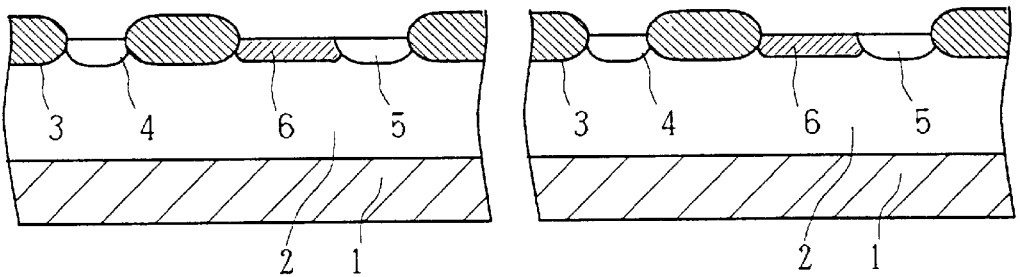
FIGS. 18(a) to 18(c) show steps of the manufacturing process for semiconductor device according to a sixth embodiment of the present invention.
Figure 18B:
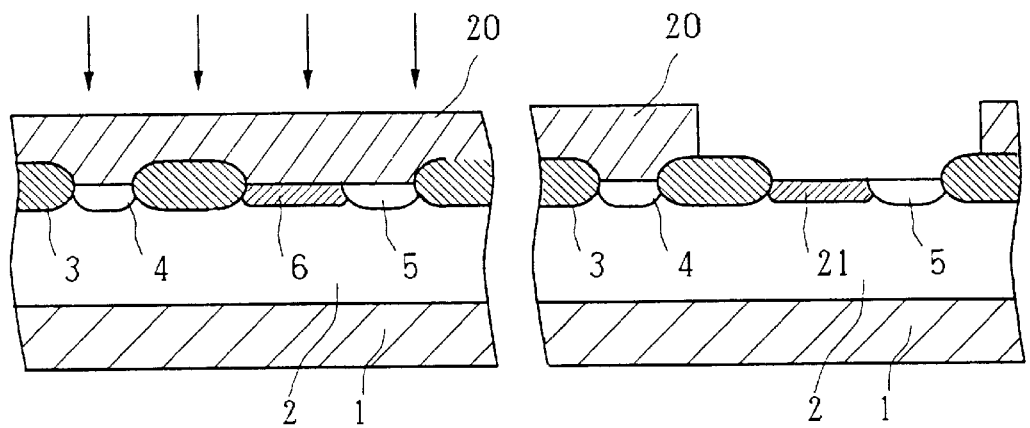
Figure 18C:
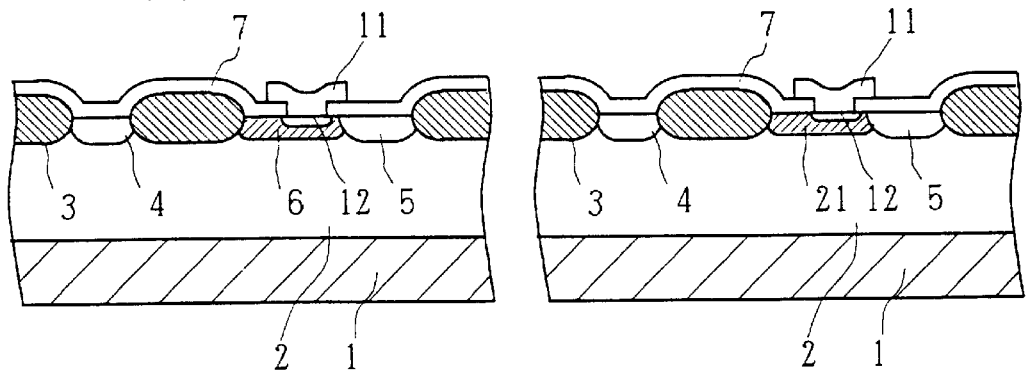

FIGS. 18(a) through 18(c) show the manufacturing process for bipolar transistors according to the sixth embodiment of the present invention. First, as shown in FIG. 18(a), for both transistor regions I and J, an n-type well 2 and an isolation oxide film 3 are formed on a p-type substrate 1. The n-type well 2 may be formed by thermal diffusion or ion implantation. In this embodiment, a bipolar transistor is formed in the n-type well 2. However, the bipolar transistor may be formed in an epitaxial layer or an n+ buried layer.

Thereafter, a collector lead-out section 4, a base lead-out section 5 and an intrinsic base layer or a link base layer 6 are formed in the respective regions I and J.

Subsequently, as shown in FIG. 18(b), a resist pattern 20 is formed with opening only on the base area of the region J, and p-type impurities such as boron B or $BF_2$ are additionally implanted in the region J to form a thick base layer 21.

Subsequently, as shown in FIG. 18(c), an inter-layer insulating film 7 is formed over the entire surface, and emitter regions are opened in the respective regions I and J. Next an emitter electrode 11 and an emitter 12 are formed respectively. In this case, the emitter electrode 11 may be polysilicon or polycide, while the emitter 12 may be formed by ion implantation or impurity diffusion from the emitter electrode 11.

With such approach, since the base 21 of the transistor J has higher concentration than that of the base 6 of the transistor I, two types of bipolar transistors with different characteristics can be formed.

Here, for forming the intrinsic base layer 6 in FIG. 18(a), ion implantation for adjusting the threshold voltage of, for example, an NMOS transistor may be utilized. In addition, for implanting ions for forming the thick base layer 21, p– implantation for manufacturing the peripheral circuit region, for example a PMOS transistor, may be utilized. With such approach, bipolar transistors with different characteristics may be simultaneously and concurrently manufactured together with other circuits such as SRAM without increasing the number of manufacturing steps.

Seventh embodiment

Figure 19A:
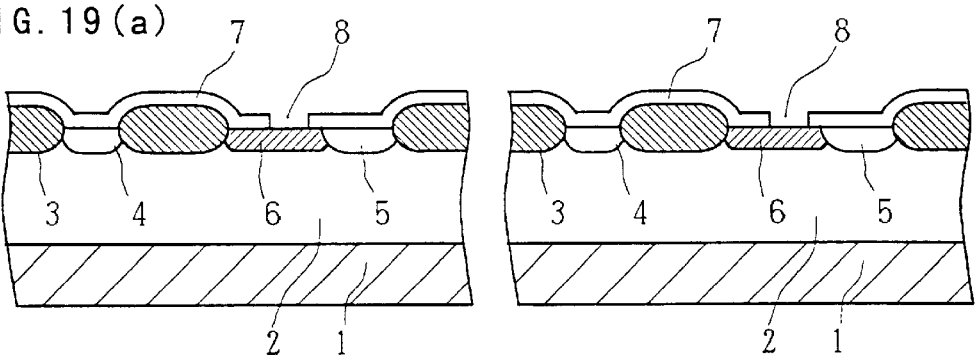
FIGS. 19(a) to 19(c) show steps of the manufacturing process for semiconductor device according to a seventh embodiment of the present invention.
Figure 19B:
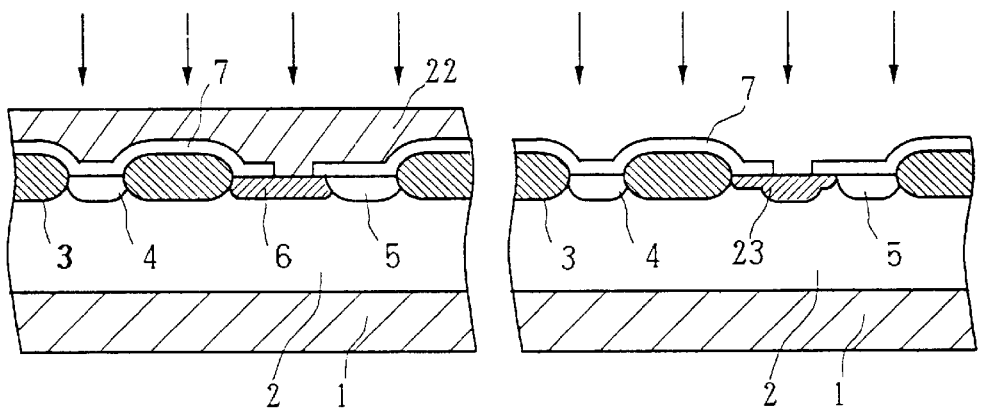
Figure 19C:
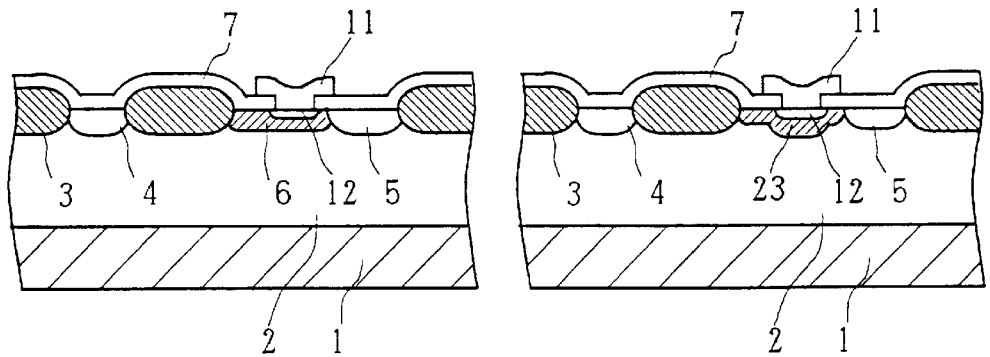

FIGS. 19(a) through 19(c) show steps of the manufacturing process for bipolar transistors according to the seventh embodiment of the present invention. First, as shown in FIG. 19(a), for both transistor regions K and L, an n-type well 2 and an isolation oxide film 3 are formed on a p-type substrate 1. The n-type well 2 may be formed by thermal diffusion or ion implantation. In this embodiment, a bipolar transistor is formed in the n-type well 2. However, the bipolar transistor may be formed in an epitaxial layer or an n+ buried layer.

Thereafter, a collector lead-out section 4, a base lead-out section 5 and an intrinsic base layer or a link base layer 6 are formed in the respective regions K and L. Further, an inter-layer insulating film 7 is formed, and an opening 8 for an emitter region is formed.

Subsequently, as shown in FIG. 19(b), a resist pattern 22 is formed with an opening only on the base area of the region L, and then, p-type impurities such as boron or $BF_2$ are implanted to form a thick base layer 23 under the emitter opening.

Subsequently, as shown in FIG. 19(c), emitter electrodes 11 and emitters 12 are formed in both regions K and L. In this case, the emitter electrode 11 may be polysilicon or polycide. The emitter 12 may be formed by ion implantation or by impurity diffusion from the emitter electrode 11.

With such manufacturing process, since the base 23 of the transistor L has higher concentration than the base 6 of the transistor K, two types of bipolar transistors with different characteristics can be formed. This embodiment is characterized in that ion implantation for the base is performed through the emitter opening.

Eighth embodiment

Figure 20A:
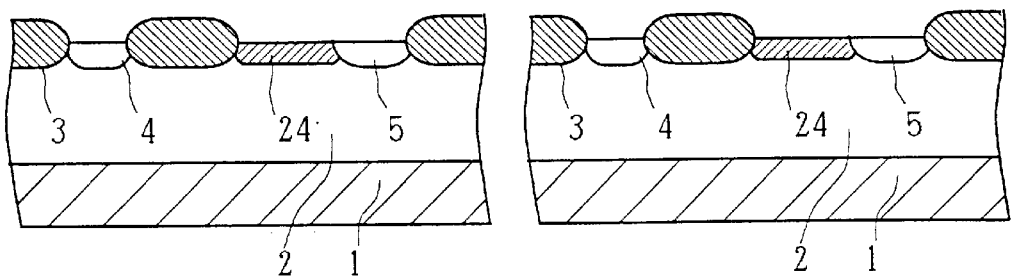
FIGS. 20(a) to 20(c) show steps of the manufacturing process for semiconductor device according to an eighth embodiment of the present invention.
Figure 20B:
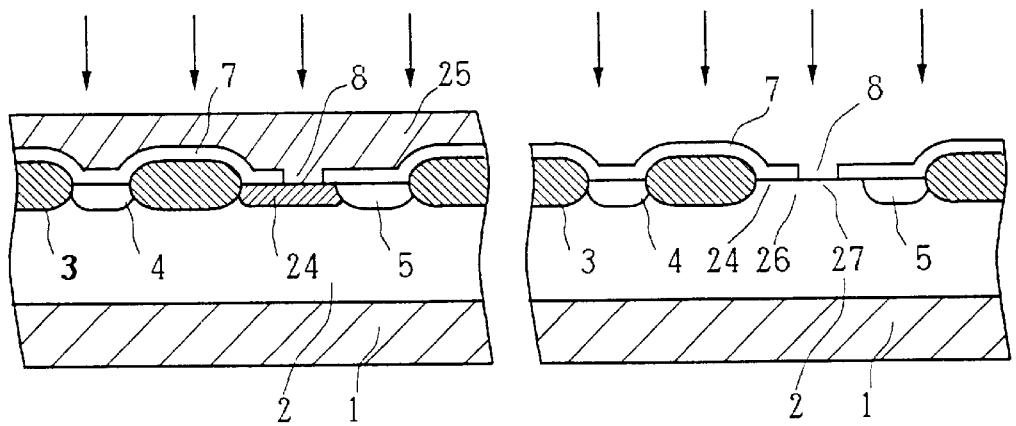
Figure 20C:
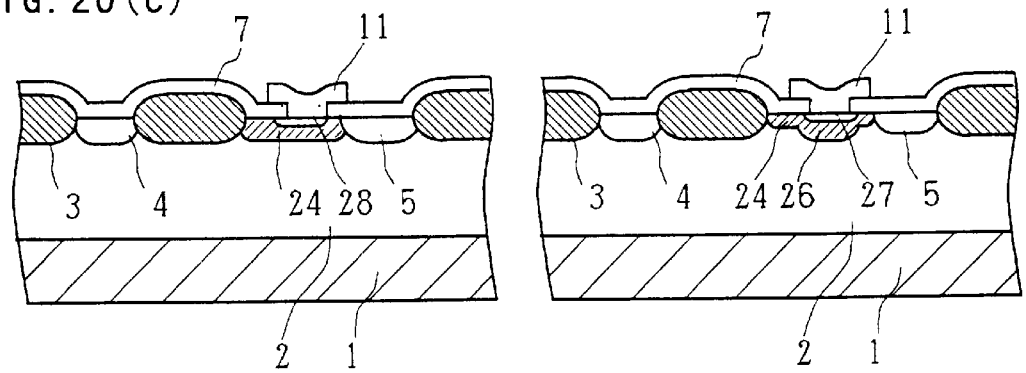

FIGS. 20(a) through 20(c) show steps of the manufacturing process for bipolar transistors according to the eighth embodiment of the present invention. First, as shown in FIG. 20(a), for both transistor regions M and N, an n-type well 2 and an isolation oxide film 3 are formed on a p-type substrate 1. The n-type well 2 may be formed by thermal diffusion or ion implantation. In this embodiment, a bipolar transistor is formed in the n-type well 2. However, the bipolar transistor may be formed in an epitaxial layer or an n+ buried layer.

Thereafter, a collector lead-out section 4, a base lead-out section 5 and an intrinsic base layer or a link base layer 6 are formed in the respective regions M and N. Then, a base layer 24 serving as a link base layer of the bipolar transistor N and an intrinsic base layer of the bipolar transistor M are formed.

Subsequently, as shown in FIG. 20(b), an inter-layer insulating film 7 is formed, and an opening 8 for emitter region is formed. A resist pattern 25 with an opening only on the transistor forming region N is formed. Then, an intrinsic base layer 26 is formed in the transistor N by ion implantation of p-type impurities such as boron B. Then, an emitter 27 is formed by ion implantation of n-type impurities such as arsenic As.

Subsequently, as shown in FIG. 20(c), the resist 25 on the region M is removed, and emitter electrodes 11 are formed on both transistors M and N. Then, an emitter 28 is formed in the transistor M by impurity diffusion from the emitter electrode 11. In this case, the emitter electrode 11 may be polysilicon or polycide.

With such manufacturing process, since the emitters 27 and 28 of the transistors M and N are formed in separate processes, and the intrinsic bases 26 and 24 are separately and independently formed, two types of bipolar transistors with different characteristics can be formed.

FIG. 27 is a table comparing the manufacturing process for bipolar transistors of FIGS. 18(a)–18(c), 19(a)–19(c), and 20(a)–20(c) described above. FIG. 27 shows the relationship of the hole forming step for the bipolar transistors i.e. emitter openings, and the fact that other steps are arranged to be performed as concurrently as possible to minimize the number of steps.

Ninth embodiment

Figure 21A:
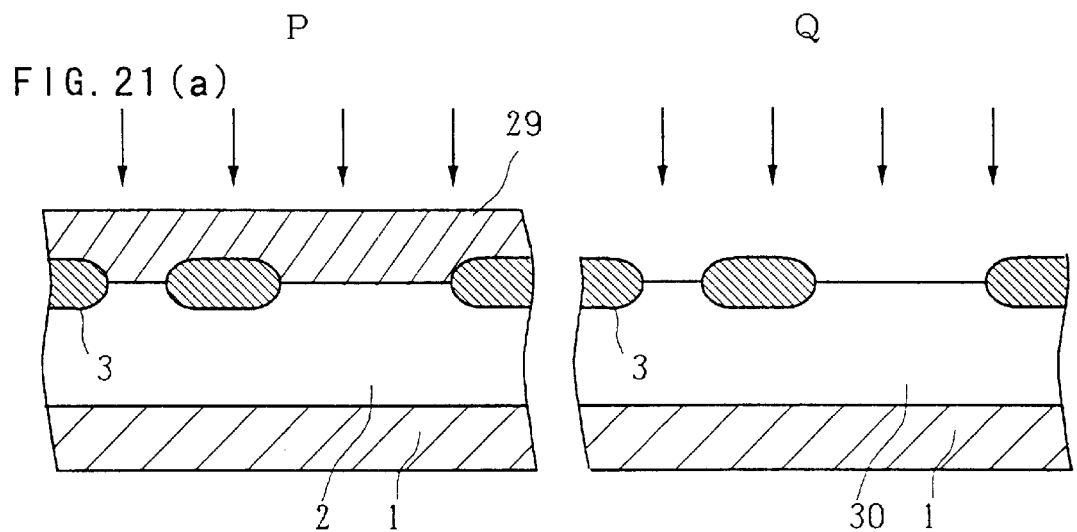
FIGS. 21(a) and 21(b) show steps of the manufacturing process for semiconductor device according to a ninth embodiment of the present invention.
Figure 21B:
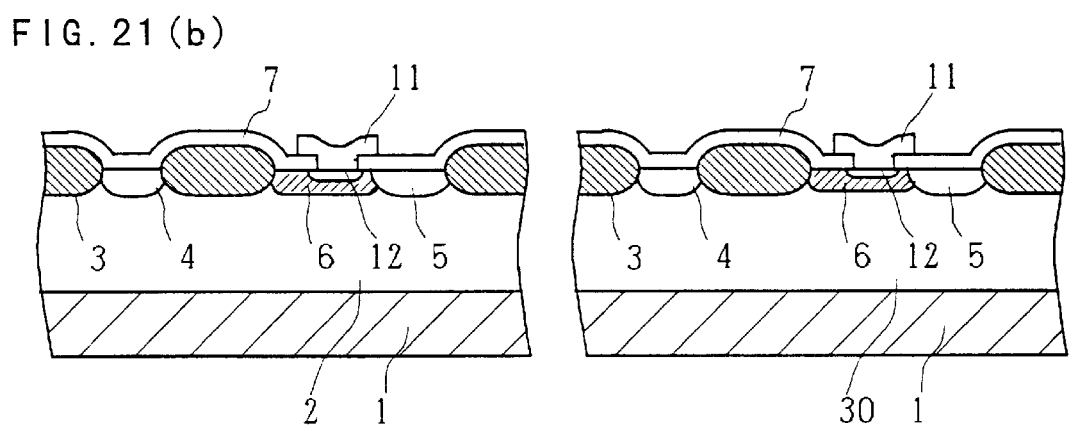

FIGS. 21(a) through 21(c) show steps of the manufacturing process for bipolar transistors according to the ninth embodiment of the present invention. First, as shown in FIG. 21(a), for transistor forming regions for both transistors P and Q, an n-type well 2 and an isolation oxide film 3 are formed on a p-type substrate 1. The n-type well 2 may be formed by thermal diffusion or ion implantation. In this embodiment, a bipolar transistor is formed in the n-type well 2. However, the bipolar transistor may be formed in an epitaxial layer or an n+ buried layer.

Subsequently, a resist pattern 29 is formed with an opening on the bipolar transistor forming area in the region Q, and ions of n-type impurities such as phosphor are implanted in the region Q to form a collector region 30 with high concentration.

Subsequently, as shown in FIG. 21(b), a collector lead-out section 4, a base lead-out section 5 and an intrinsic base or a link base layer 6 are formed in the respective regions P and Q. In addition, after an inter-layer region 7 is formed, an opening for emitter region is formed. Then, emitter electrodes 11 and emitters 12 are formed in both regions P and Q. In this case, the emitter electrode 11 may be polysilicon or polycide. In addition, the emitter 12 may be formed by ion implantation or impurity diffusion from the emitter electrode 11.

With such a process, since the collector 30 of the transistor Q has higher concentration than the collector 2 of the transistor P, two types of bipolar transistors with different characteristics can be formed. This process may be carried out by using epitaxial layers and n+ buried layers. In such case, bipolar transistors with different characteristics can be obtained by changing the concentration in each epitaxial layer.

Tenth Embodiment

Figure 22A:
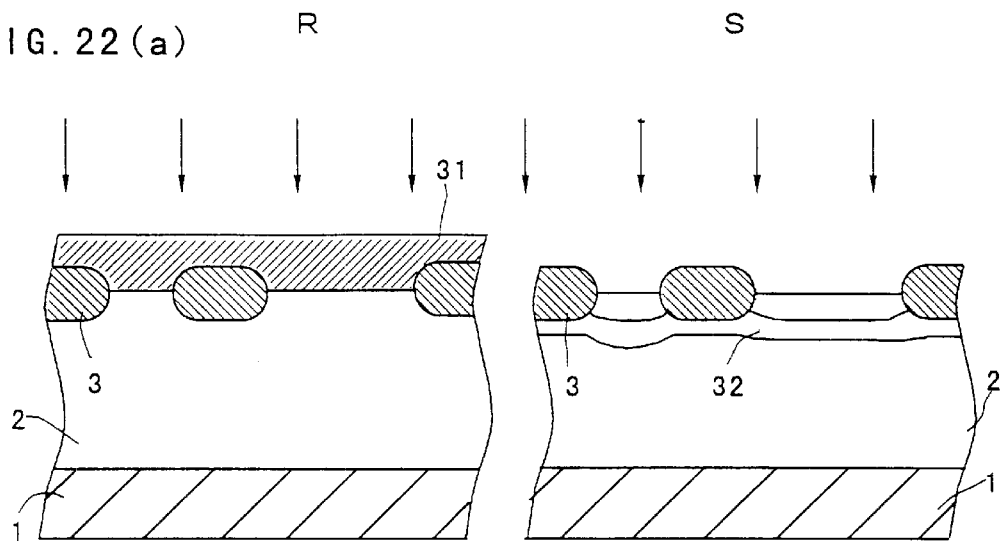
FIGS. 22(a) and 22(b) show steps of the manufacturing process for semiconductor device according to a tenth embodiment of the present invention.
Figure 22B:
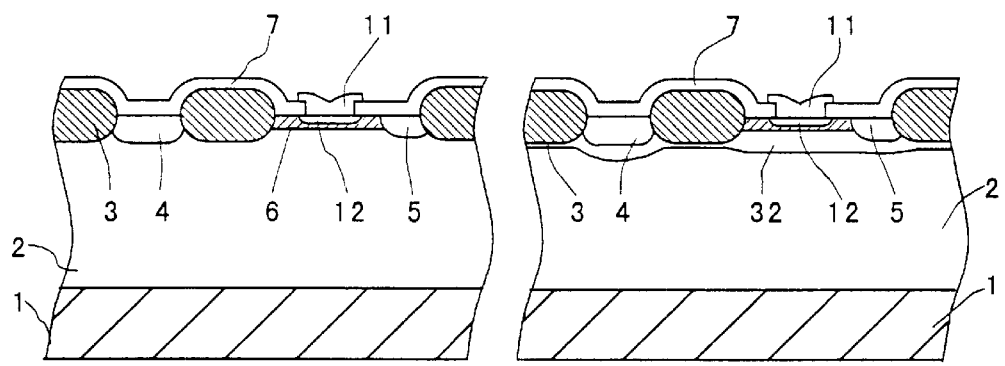

FIGS. 22(a) through 22(b) show steps of the manufacturing process for bipolar transistors according to the tenth embodiment of the present invention. First, as shown in FIG. 22(a), an n-type well 2 and an isolation oxide film 3 are formed on a p-type substrate 1 for transistor forming regions R and S. The n-type well 2 may be formed by thermal diffusion or ion implantation. In this embodiment, a bipolar transistor is formed in the n-type well 2. However, the bipolar transistor may be formed in an epitaxial layer or an n+ buried layer.

Subsequently, a resist pattern 31 is formed with an opening on the bipolar transistor forming area in the region S, and ions of n-type impurities, for example phosphor P, are implanted to form an n-type collector layer 32 with high concentration under the base forming region in the region S.

Subsequently, a collector lead-out section 4, a base lead-out section 5, and an intrinsic base layer or a link base layer 6 are formed in the respective regions R and S except for the resist 31 in the region R. Further, an inter-layer insulating film 7 is formed in both regions R and S, and an opening for emitter region is formed.

Then, emitter electrodes 11 and emitters 12 are formed in both regions R and S. In this case, the emitter 12 may be formed by diffusion from the emitter electrode 11, or by ion implantation before the formation of the emitter electrode 11. Thus, two types of transistors are formed.

With such approach, since the bipolar transistor S has, in its collector region, an n-type collector 32 with higher concentration than the collector 2 of the bipolar transistor R, two types of the bipolar transistors R and S with different characteristics can be formed.

In addition, the n-layer 32 with high concentration in FIG. 22(a) of this embodiment may be concurrently formed in the process for forming a conductive layer for reducing collector resistance, or may be commonly used with the conductive layer for reducing the collector resistance. With such approach, the bipolar transistors with different characteristics can be simultaneously and concurrently manufactured in the manufacturing processes for other circuits without increasing the number of manufacturing steps.

Furthermore, the n-layer 32 with high concentration in FIG. 22(a) of this embodiment may be formed concurrently and commonly with the implantation of an n+ isolation layer in the PMOS transistor forming region. With such an approach, the bipolar transistors with different characteristics can be simultaneously and concurrently manufactured in the manufacturing processes for other circuits without increasing the number of manufacturing steps.

Eleventh Embodiment

Figure 23A:
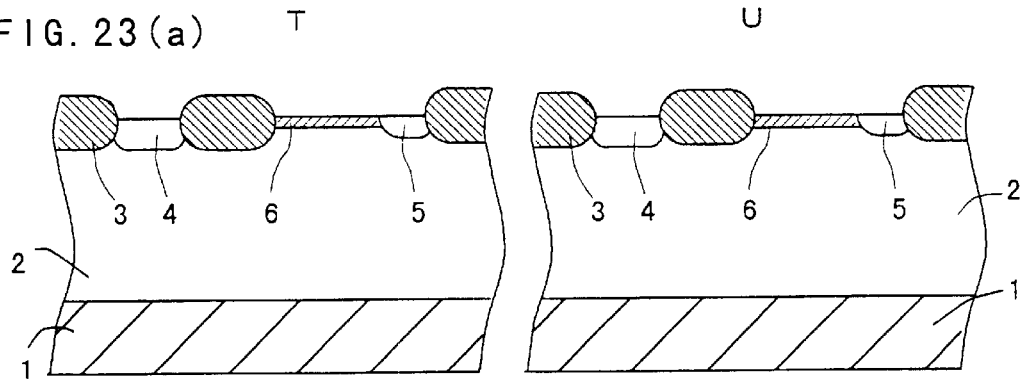
FIGS. 23(a) to 23(c) show steps of the manufacturing process for semiconductor device according to an eleventh embodiment of the present invention.
Figure 23B:
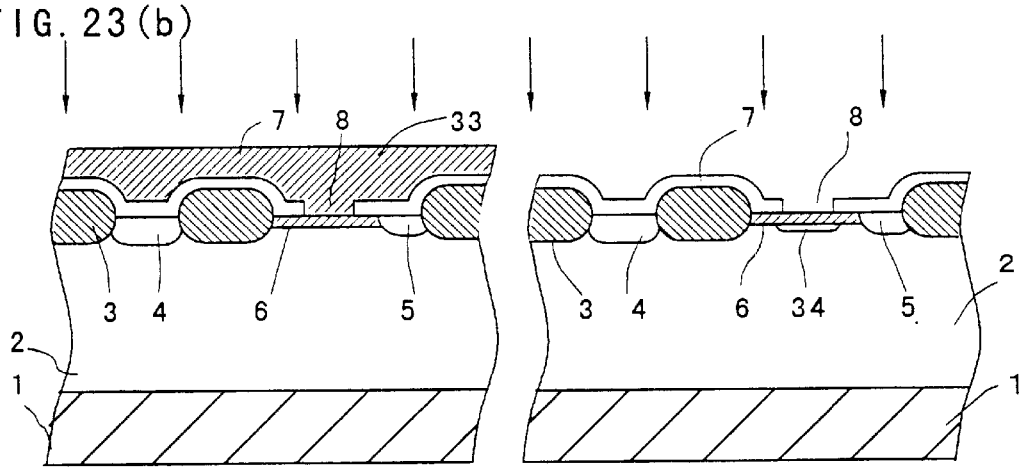
Figure 23C:
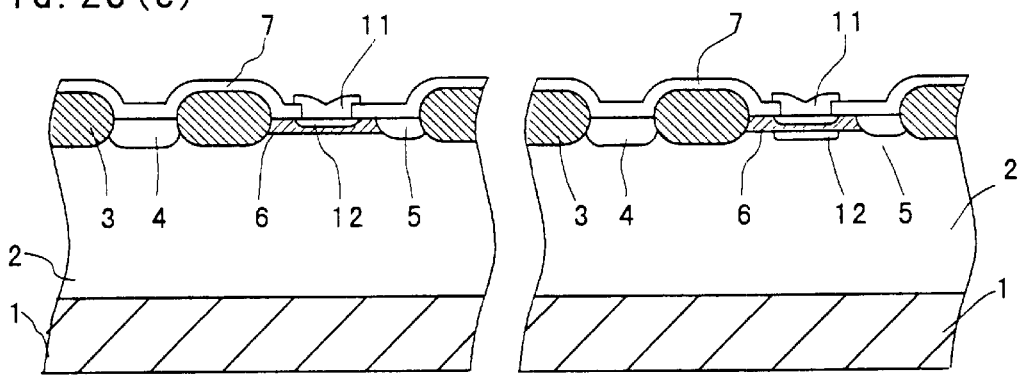

FIGS. 23(a) through 23(c) show steps of the manufacturing process for bipolar transistors according to the eleventh embodiment of the present invention. First, as shown in FIG. 23(a), an n-type well 2 and an isolation oxide film 3 are formed on a p-type substrate 1 for both transistor forming regions T and U. The n-type well 2 may be formed by thermal diffusion or ion implantation. In this embodiment, a bipolar transistor is formed in the n-type well 2. However, the bipolar transistor may be formed in an epitaxial layer or an n+ buried layer.

Thereafter, a collector lead-out section 4, a base lead-out section 5 and an intrinsic base layer or a link base layer 6 are formed in the respective regions T and U.

Subsequently, as shown in FIG. 23(b), an inter-layer region 7 is formed, and an opening 8 for emitter region is formed. Then, a resist pattern 33 is formed with an opening on the bipolar transistor forming area in the region U, and ions of n-type impurities are implanted in the region U to form an n-type region 34 with high concentration under the base layer 6.

Subsequently, as shown in FIG. 23(c), emitter electrodes 11 and emitters 12 are formed in both transistors T and U. In this case, the emitter electrode 11 may be polysilicon or polycide. In addition, the emitter 12 may be formed by ion implantation or impurity diffusion from the emitter electrode 11.

With such a manufacturing process, since the bipolar transistor u has, in its collector region, an n-type layer 34 with higher concentration than in the collector 2 of the bipolar transistor T, two types of the bipolar transistors with different characteristics can be formed.

FIG. 28 is a table comparing the manufacturing process for bipolar transistors of FIGS. 21(a) and 21(b), 22(a) and 22(b), and 23(a) and 23(c) described above. FIG. 28 shows the relationship of the hole forming step for the bipolar transistors i.e. emitter openings, and the fact that other steps are arranged to be performed as concurrently as possible to minimize the number of steps.

The second to eleventh embodiments described above illustrate manufacturing processes for a pair of bipolar transistors with different characteristics. However, the combination of manufacturing processes for a pair of bipolar transistors with different characteristics is not limited to the illustrated combinations. It is contemplated to employ any other suitable combinations of the bipolar transistors shown in the above figures. Furthermore, it may be possible to manufacture transistors of different characteristics in such a way that the profiles of two or more of the emitter, base and collector between transistors are different from each other.

Twelfth Embodiment

Figure 24A:
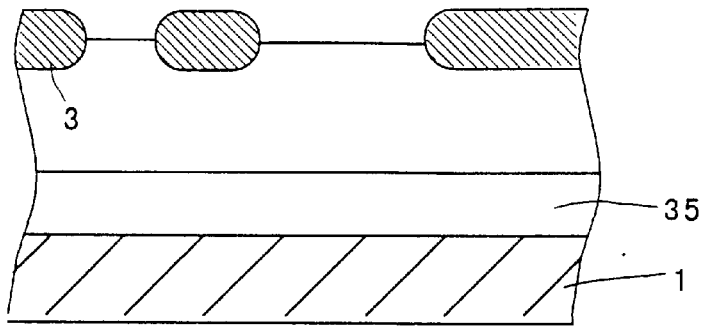
FIGS. 24(a) to 24(c) show steps of the manufacturing process for semiconductor device according to a twelfth embodiment of the present invention.
Figure 24B:
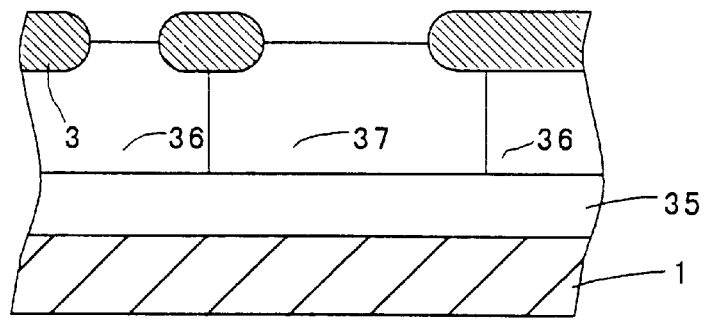
Figure 24C:
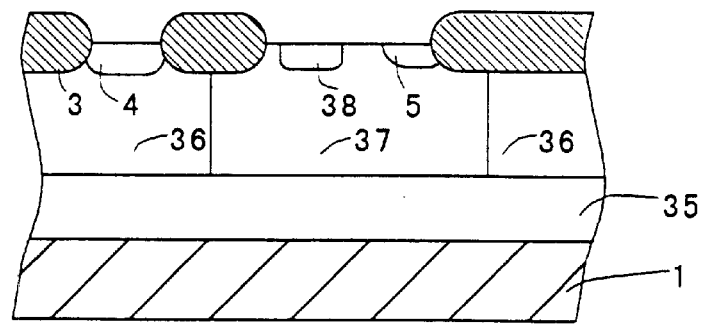

FIGS. 24(a) through 24(c) illustrate steps of the manufacturing process for a bipolar transistor according to the twelfth embodiment of the present invention. First, as shown in FIG. 24(a), an isolation oxide film 3 is formed on a p-type substrate 1, and an n– buried layer 35 for decreasing soft errors in the memory cell region is also formed in the bipolar transistor forming region. Thereafter, as shown in FIG. 24(b), an n-well 36 and a p-well 37 surrounded by the n-well 36 are formed.

Subsequently, as shown in FIG. 24(c), a collector lead-out section 4 and an emitter 38 are formed concurrently when an n+ S/D (source/drain) of an NMOS transistor is formed, while a base lead-out section 5 is formed concurrently when a p+ S/D of a PMOS transistor is formed.

Thus, a bipolar transistor with high breakdown voltage can be formed by using the bottom n-layer 35 as the collector, and the p-well 37 as the base in correspondence to the SRAM manufacturing process, and by forming the emitter 38 in correspondence to the formation of n+ S/D (source/drain) in the memory cell region. When this manufacturing process is used together with the manufacturing process for other bipolar transistors according to the embodiments described above, it is possible to obtain bipolar transistors with characteristics different from each other.

Thirteenth Embodiment

Figure 29:
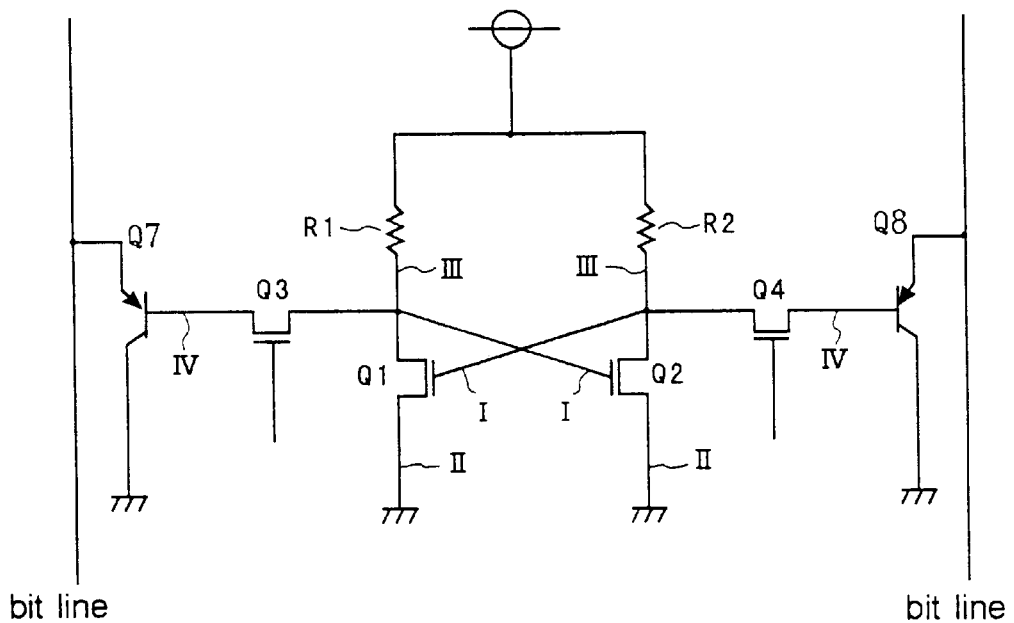
FIG. 29 shows an equivalent circuit of a memory cell in a SRAM according to the thirteenth embodiment of the present invention.

FIG. 29 shows an equivalent circuit of a memory cell in a SRAM according to the thirteenth embodiment of the present invention. As shown in the drawing, the memory cell is comprised of six elements including NMOS type driver transistors Q1,Q2, access transistors Q3,Q4, and resistors R1,R2, and further pnp-type transistors Q7,Q8 are added for acceleration of response. In total, the memory cell is comprised of eight elements.

Figure 30:
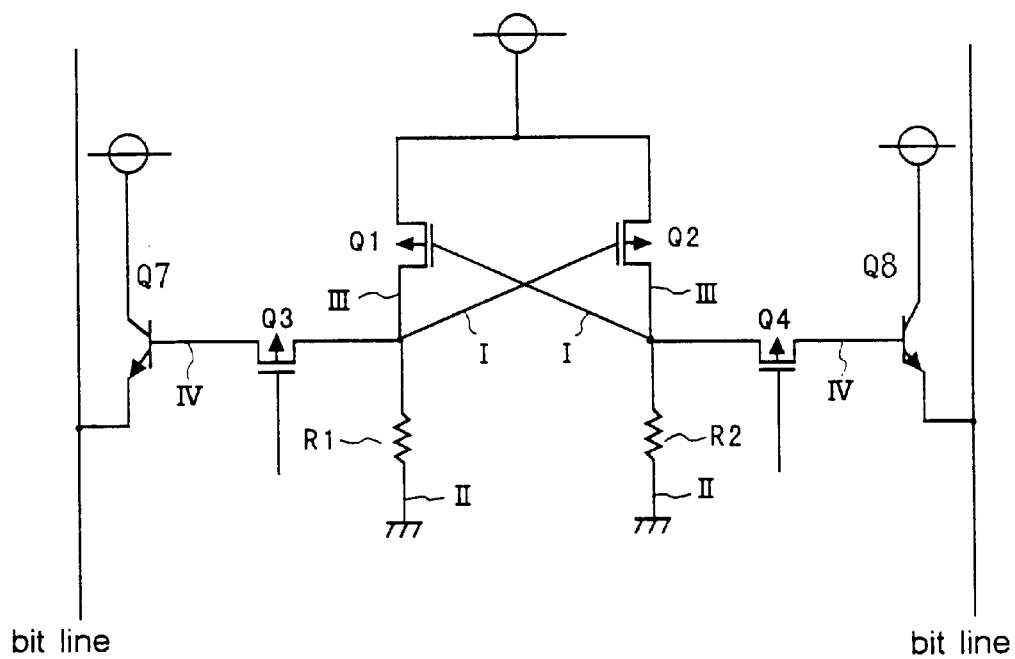
FIG. 30 shows an equivalent circuit of another memory cell in a SRAM according to the thirteenth embodiment of the present invention.

FIG. 30 shows an equivalent circuit of another memory cell in a SRAM according to the thirteenth embodiment of the present invention. As shown in the drawing, the memory cell is comprised of six elements including PMOS type driver transistors Q1,Q2, access transistors Q3,Q4, and resistors R1,R2, and further npn-type transistors Q7,Q8 are added for acceleration of response. In total, the memory cell is comprised of eight elements.

Symbols I–IV in the drawings correspond to the holes formed in the manufacturing process of a memory cell region, and indicate the corresponding positions in the circuit in the same way as in FIG. 4.

Bipolar transistors have high driving capability. Therefore, bipolar transistors are efficiently used in memory cells to obtain accelerated speed. FIG. 29 and FIG. 30 illustrate the examples of such applications.

In such an application, bipolar transistors are desirably manufactured concurrently with hole processes and utilizing holes in the memory cell, to avoid increase of memory cell area due to increase of element number. For instance, in case of FIG. 29, a bipolar transistor is desirably manufactured at a location of the hole IV indicated in an equivalent circuit of FIG. 4, that is the location of the first contact hole IV connecting a drain region of a access transistor and a bit line. This location corresponds to a contact hole 118 shown in FIG. 7(h).

As in this case, when a bipolar transistor is applied to a NMOS memory, the bipolar transistor is of pnp-type, because a well used for a collector is p-type well.

It may be difficult to manufacture a pnp-type bipolar transistor at a contact, i.e. at a hole IV in FIG. 4, since the diffusion coefficient of boron for forming a p+ region is large. In that case, the structure shown in FIG. 30 is preferably employed using PMOS memory cell combined with npn-type bipolar transistors.

Characteristics of the bipolar transistors can be changed by ion implantation or other ways, when a different bipolar transistor characteristic is needed due to non-symmetric layout of a memory cell.

In the above explanation, a bipolar transistor is manufactured using a first contact hole (the hole IV in FIG. 4) which connects a drain region of an access transistor and a bit line. However, a bipolar transistor may be manufactured using a gate contact hole 106 (hole I), a first polycontact hole 112 (hole II), or a second polycontact hole (hole III) which are shown in FIG. 4 and explained with reference to FIG. 5 to FIG. 7. Alternatively, a plurality of bipolar transistor having different characteristics may be manufactured using a plurality of holes formed in a memory cell region.

Hereinafter, a manufacturing process of a bipolar transistor in a memory cell region using a first contact hole (hole IV) will be explained.

(IV-2) Manufacturing Process of a Bipolar Transistor Using a First Contact Hole (Hole IV)

Figure 31A:
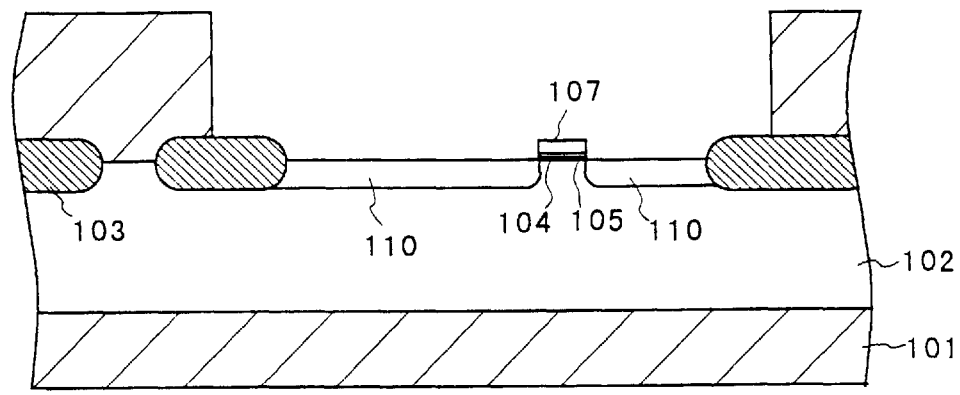
FIGS. 31(a) through 31(c) show steps of the manufacturing process for another bipolar transistor according to the thirteenth embodiment of the present invention.
Figure 31B:
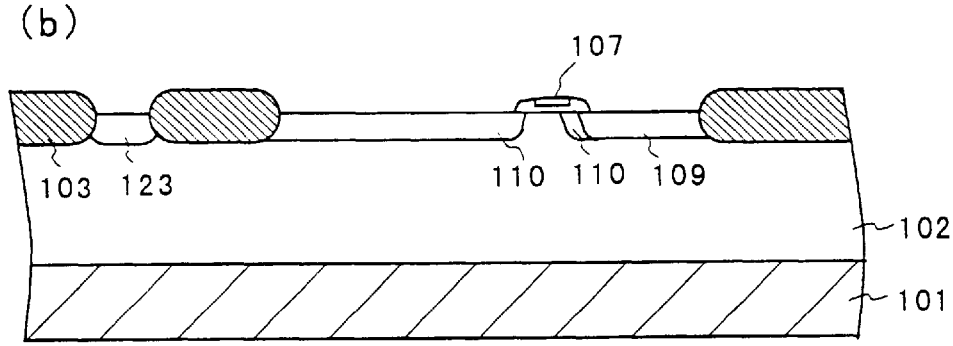
Figure 31C:
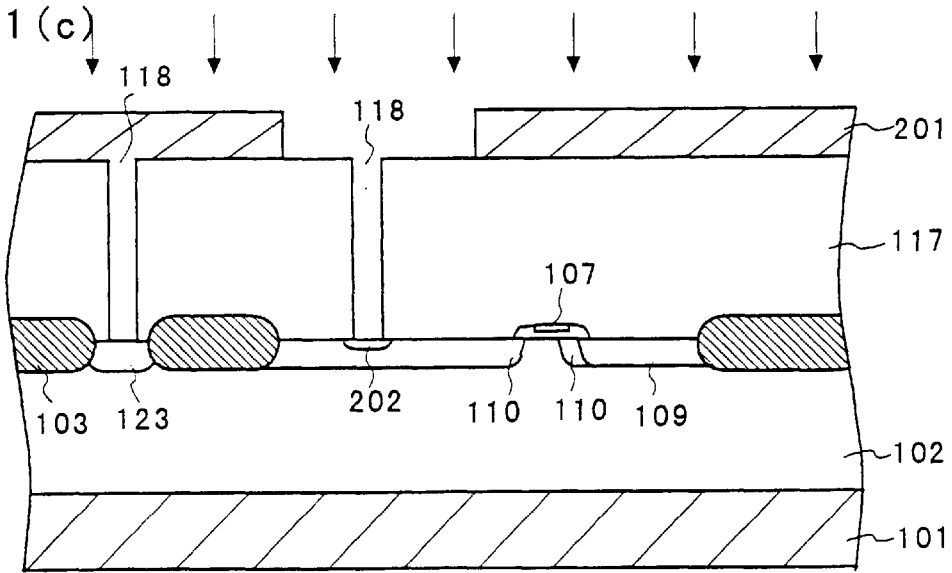

FIGS. 31(a) through 31(c) show steps of the manufacturing process for another bipolar transistor according to the thirteenth embodiment of the present invention. First, as shown in FIG. 31(a), a p-type well 102 is formed in a p-type substrate 102 to serve as a collector region. The p-type well 102 may be formed by either thermal diffusion or ion implantation. An isolation oxide film 103 is formed on a p-type substrate 102 in the memory cell region. In this embodiment, a bipolar transistor is formed in the p-type well 102. However, the bipolar transistor may be formed in an epitaxial layer or a p+ buried layer.

Then, a gate oxide film 104, polysilicon 105 for gate electrode, a polysilicon (polycide) 107 for a gate electrode are formed, followed by patterning for a gate electrode. Then, an intrinsic base layer 110 is formed concurrently and commonly with formation of an n– region in the memory cell region.

Afterwards, when a n+ S/D (source/drain) is formed for NMOS transistors in the memory cell region, an external base region 109 is formed as shown in FIG. 31(b). And, when a p+ S/D (source/drain) is formed for PMOS transistors in the peripheral circuit region, a collector lead-out section 123 is formed.

Figure 32A:
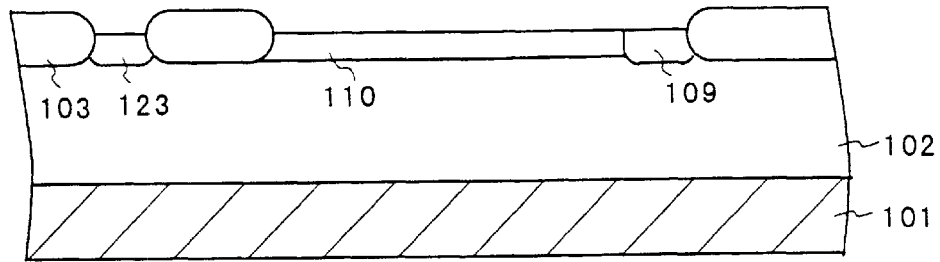
FIGS. 32(a) through 32(c) show steps of the manufacturing process for another bipolar transistor according to the fourteenth embodiment of the present invention.
Figure 32B:
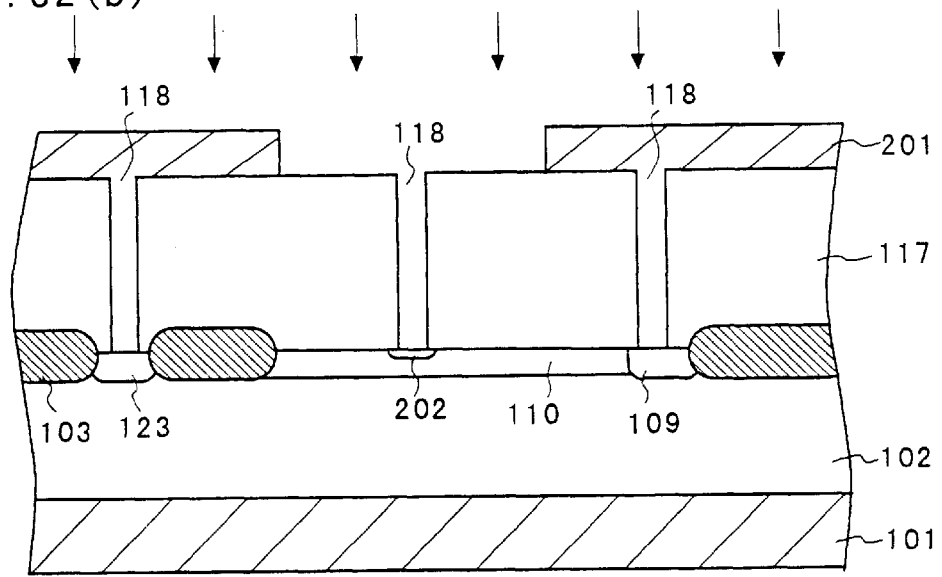
Figure 32C:
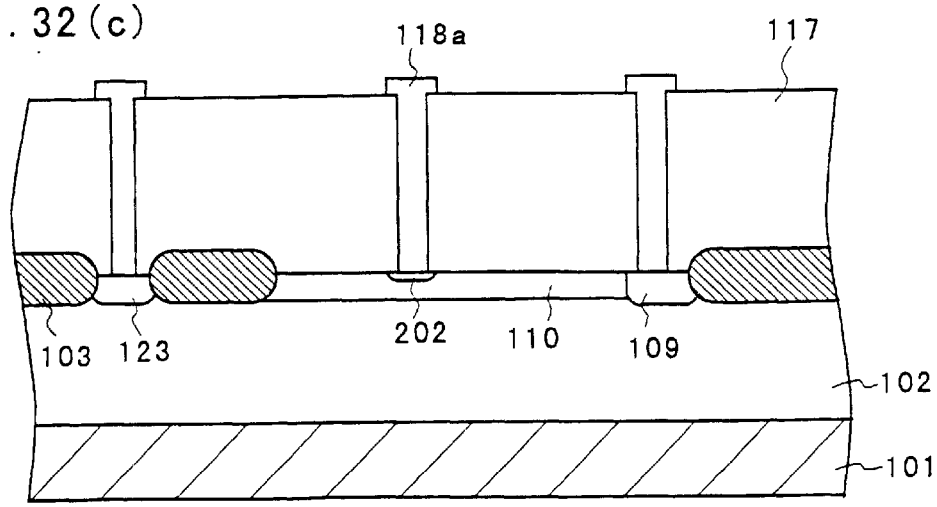

Thereafter, as shown in FIG. 32(c), an interlayer insulating film 117 is formed, and then concurrently when a first contact hole 118 (hole IV) is formed in the memory cell region, a contact hole 118 for a collector 123 is formed.

Then, a resist pattern 201 is formed, and a p+ region as an emitter 202 is formed by ion implantation of p-type impurities such as boron B.

As explained above, bipolar transistors are manufactured as required in the memory cell region using any of the holes formed for manufacturing memory cells. Alternatively, bipolar transistors may be manufactured using any of the holes in the memory cell region which are formed separately from the holes for memory cell. Further, bipolar transistors of different characteristics may be formed using these plurality of holes.

Fourteenth embodiment

In the peripheral circuit section, bipolar transistors of different characteristics may be preferably of pnp-type, when holes are concurrently formed in the memory cell section and the peripheral circuit section, or when impurities are implanted concurrently to facilitate manufacturing process. The manufacturing process of bipolar transistors of this kind has been explained in detail. On the other hand, where the characteristics of the bipolar transistor has priority, then bipolar transistors of npn-type are preferred.

Now, explanation is given for the manufacturing process for a pnp-type bipolar transistor in the peripheral circuit section in correspondence to formation of a first contact hole (hole IV) in the memory cell section.

(IV-3) Manufacturing Process for a Pnp-type Bipolar Transistor in Correspondence to Formation of a First Contact Hole (Hole IV).

FIGS. 32(a) through 32(c) show steps of the manufacturing process for another bipolar transistor according to the fourteenth embodiment of the present invention. First, as shown in FIG. 32(a), a p-type well 102 is formed in a p-type substrate 102 to serve as a collector region, in the same way as a p-type well for a NMOS transistor in the memory cell region. An isolation oxide film 103 is formed on a p-type substrate 102 in the same way as in a NMOS transistor in the memory cell region. The p-type well 102 may be formed by either thermal diffusion or ion implantation. In this embodiment, a bipolar transistor is formed in the p-type well 102. However, the bipolar transistor may be formed in an epitaxial layer or a p+ buried layer.

Afterwards, an external base region 109 is formed, when a n+ S/D (source/drain) is formed for NMOS transistors in the memory cell region. Then, an intrinsic base layer 110 is formed concurrently and commonly with formation of an n-region in the memory cell region.

Thereafter, as shown in FIG. 32(c), an interlayer insulating film 117 is formed. Then, concurrently when a first contact hole 118 (hole IV) is formed in the memory cell region, a hole 28 for forming an emitter, and each contact hole 118 for a base lead-out 109 and a collector 123 are formed.

Then a resist pattern 201 is formed, and a p+ region as an emitter 202 is formed by ion implantation of p-type impurities such as boron B. Then, as shown in FIG. 32(c), a conductive lead layer 118a is formed including a contact hole 118.

Thus, pnp-type bipolar transistors of different characteristics may be manufactured by forming holes in the peripheral circuit section in correspondence to formation of a first contact hole (hole IV) in the memory cell section.

As has been explained above in detail, according to the present invention, a plurality of bipolar transistors of different characteristics may be formed, by using holes formed concurrently in a memory cell section and/or in a peripheral circuit section, which includes decoders, buffers, etc., adjacent to the memory cell section by an efficient manufacturing process.

Further, bipolar transistors are efficiently formed in a memory cell section using holes for forming memory cells.

Particularly, bipolar transistors are efficiently formed in a memory device such as a SRAM using MOS transistors, in a memory cell section and in its peripheral circuit section.

Obviously, numerous additional modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A manufacturing process for a semiconductor device having a semiconductor memory circuit region containing semiconductor memories, and a peripheral circuit region disposed around said semiconductor circuit region and containing bipolar transistors, said process comprising the steps of:
   forming contact holes, for said semiconductor memories, selectively in an insulating film in said semiconductor memory circuit region;
   forming a plurality of openings selectively in an insulating film, concurrently with forming one of said contact holes, in bipolar transistor forming regions;
   forming contact conductors in said contact holes; and
   forming bipolar transistors at the locations of said openings in said bipolar transistor forming regions by implanting impurities through at least one of said plurality of openings.

2. The manufacturing process for a semiconductor device as recited in claim 1, wherein said bipolar transistors are formed with different characteristics.

3. The manufacturing process for a semiconductor device as recited in claim 1, wherein said bipolar transistors are formed at least by way of ion implantation through said openings in said bipolar transistor forming regions.

4. The method according to claim 1, wherein:
   forming said contact holes in said semiconductor memory circuit region comprises forming holes in a first insulating film, and
   forming said openings in said bipolar transistor forming regions comprises forming openings in said first insulating film.

5. The manufacturing process for a semiconductor device according to claim 2, wherein said bipolar transistors with characteristics different from each other are formed by:
   covering one of said openings in said bipolar transistor forming regions, and
   implanting impurity ions into another one of said openings in said bipolar transistor forming regions to form a different emitter.

6. The manufacturing process for a semiconductor device according to claim 2, wherein the bipolar transistors with characteristics different from each other are formed by:
   preparing emitter forming layers in said plurality of openings in said bipolar transistor forming region,
   covering an emitter forming layer in one of said openings in said bipolar transistor forming regions with a resist, and
   implanting impurity ions into an emitter forming layer in another one of said openings in said bipolar transistor forming regions to form a different emitter.

7. The manufacturing process for a semiconductor device according to claim 2, wherein the bipolar transistors with characteristics different from each other are formed by:
  implanting ions in one of said openings in said bipolar transistor forming regions to form an emitter layer,
  covering said emitter layer in said one of said openings with a resist, and
  implanting impurity ions in another one of said openings, to form a different emitter.

8. The manufacturing process for a semiconductor device according to claim 2, wherein the bipolar transistors with characteristics different from each other are formed by:
  covering a location of one of said openings in the bipolar transistor forming regions with a resist, and
  implanting impurity ions in another one of said openings in said bipolar transistor forming regions to form a different base.

9. The manufacturing process for a semiconductor device according to claim 2, wherein the bipolar transistors with characteristics different from each other are formed by:
  covering one of said openings in said bipolar transistor forming regions with a resist, and
  implanting ions in another one of said openings in said bipolar transistor forming region to form a different base.

10. The manufacturing process for a semiconductor device according to claim 2, wherein the bipolar transistors with characteristics different from each other are formed by:
  covering one of said openings in said bipolar transistor forming regions with a resist, and
  implanting different impurity ions in another one of said openings in said bipolar transistor forming regions to form a different base and a different emitter.

11. The manufacturing process for a semiconductor device according to claim 2, wherein the bipolar transistors with characteristics different from each other are formed by:
  covering one location for forming a transistor in said bipolar transistor forming regions with a resist, and
  implanting impurity ions additionally in another location for forming a transistor in said bipolar transistor forming regions to form a different collector region by changing a concentration of impurity in said collector region.

12. The manufacturing process for a semiconductor device according to claim 2, wherein the bipolar transistors with characteristics different from each other are formed by:
  covering one location for forming a transistor in said bipolar transistor forming regions with a resist, and
  implanting impurity ions additionally in another location for forming a transistor in said bipolar transistor forming regions to form a different collector layer by providing a high concentration layer in the collector region.

13. The manufacturing process for a semiconductor device according to claim 2, wherein the bipolar transistors with characteristics different from each other are formed by:
  covering one of said openings in said bipolar transistor forming regions with a resist, and
  implanting impurity ions in another one of said openings to form a different collector.

14. The manufacturing process for a semiconductor device according to claim 2, wherein the bipolar transistors with characteristics different from each other are formed by:
  forming an emitter by either implanting ions or diffusing impurity into a base formed by ion implantation or impurity diffusion in one of said openings in said bipolar transistor forming regions, and
  forming an emitter by implanting ions in a well of one conductivity type surrounded by another well of another conductivity type in another one of said openings in said bipolar transistor forming regions.

15. A manufacturing process for a semiconductor device having a semiconductor memory circuit region containing semiconductor memories, and a peripheral circuit region disposed around the semiconductor memory circuit region and containing bipolar transistors, said process comprising the steps of:
  forming contact holes, for said semiconductor memories, selectively in insulating films in different manufacturing steps, in said semiconductor memory region;
  forming a plurality of openings selectively in insulating films, concurrently with forming each of said contact holes in correspondence to said different manufacturing steps, in bipolar transistor forming regions;
  forming contact conductors in said contact holes; and
  forming bipolar transistors at locations of said openings in said bipolar transistor forming regions by implanting impurities through at least one of said plurality of openings.

16. The manufacturing process for a semiconductor device as recited in claim 15, wherein said bipolar transistors are formed with different characteristics in said openings corresponding to one of said different manufacturing steps.

17. The manufacturing process for a semiconductor device as recited in claim 15, wherein said bipolar transistors are formed with different characteristics in said openings corresponding to said different manufacturing steps.

18. The manufacturing process for a semiconductor device as recited in claim 15, wherein said bipolar transistors are formed at least by way of ion implantation through said openings in said bipolar transistor forming regions.

19. The method according to claim 16, wherein:
  forming said contact holes in said semiconductor memory circuit region comprises forming holes in first insulating films, and
  forming said openings in said bipolar transistor forming regions comprises forming openings in said first insulating films.

20. The manufacturing process for a semiconductor device according to claim 17, wherein the bipolar transistors with characteristics different from each other are formed by:
  forming first emitters by ion implantation or impurity diffusion in one of said openings, provided in one of said different manufacturing steps, in the bipolar transistor forming regions, and
  forming second emitters different from said first emitters in another one of said openings, provided in another one of said manufacturing steps, in said bipolar transistor forming regions.

21. The manufacturing process for a semiconductor device according to claim 17, wherein the bipolar transistors with characteristics different from each other are formed by:
  covering with a resist one of said openings, provided in one of said different manufacturing steps, in the bipolar transistor forming regions, and
  forming a different base by implanting impurity ions in the other of said openings provided in another one of said different manufacturing steps, in the bipolar transistor forming regions.

22. The manufacturing process for a semiconductor device according to claim 17, wherein the bipolar transistors with characteristics different from each other are formed by:
   covering with a resist one of said openings. provided in one of said different manufacturing steps, in the bipolar transistor forming regions, and
   forming a different collector by implanting impurity ions in another one of said openings, provided in another one of said different manufacturing steps, in said bipolar transistor forming regions.

23. The manufacturing process for a semiconductor device according to claim 17, wherein the bipolar transistors with characteristics different from each other are formed by:
   forming an emitter by implanting ions into a base formed by ion implantation or impurity diffusion in one of said openings, provided in one of a plurality of different manufacturing steps, in the bipolar transistor forming regions, and
   forming an emitter by implanting ions in a well of one conductivity type surrounded by another well of another conductivity type in another one of said openings, provided in another one of said different manufacturing steps, in said bipolar transistor forming regions.

* * * * *